(12) United States Patent
Voloh et al.

(10) Patent No.: US 12,718,652 B2
(45) Date of Patent: Aug. 25, 2026

(54) ELECTRONIC GAMING MACHINE WITH DOOR, DOOR STAY, AND DOOR STOPPER

(71) Applicant: Aristocrat Technologies Australia Pty Limited, North Ryde (AU)

(72) Inventors: Noel Voloh, Bondi Junction (AU); Vishnuraj Puthanpurayil, Epping (AU); Calvin Kim, Baulkham Hills (AU)

(73) Assignee: Aristocrat Technologies Australia Pty Limited, North Ryde (AU)

( * ) Notice: Subject to any disclaimer, the term of this patent is extended or adjusted under 35 U.S.C. 154(b) by 180 days.

(21) Appl. No.: 18/807,336

(22) Filed: Aug. 16, 2024

(65) Prior Publication Data

US 2026/0030952 A1 Jan. 29, 2026

Related U.S. Application Data

(60) Provisional application No. 63/676,183, filed on Jul. 26, 2024.

(51) Int. Cl.
*G07F 17/32* (2006.01)
*H05K 5/02* (2006.01)

(52) U.S. Cl.
CPC ....... *G07F 17/3216* (2013.01); *H05K 5/0226* (2013.01)

(58) Field of Classification Search
CPC ........... E05D 3/16; E05D 5/06; E05D 7/0407; E05D 2003/163; E05D 2005/067; E05D 3/022; A63F 13/90; G07F 17/3216
See application file for complete search history.

(56) References Cited

U.S. PATENT DOCUMENTS

| | | | | |
|---|---|---|---|---|
| 2,602,201 | A | 7/1952 | Ofeldt | |
| 8,851,989 | B2 | 10/2014 | Rosander | |
| 9,881,443 | B2 | 1/2018 | Maher | |
| 2003/0024184 | A1 | 2/2003 | Orr | |
| 2009/0227380 | A1 | 9/2009 | Seelig | |
| 2016/0343204 | A1* | 11/2016 | Maher | E05D 3/022 |
| 2019/0096171 | A1* | 3/2019 | Patel | E05D 5/06 |
| 2020/0370349 | A1* | 11/2020 | Zetti | E05F 5/02 |
| 2021/0095505 | A1* | 4/2021 | Chaudhari | G07F 17/3216 |
| 2023/0383584 | A1* | 11/2023 | Schneider | E05D 3/16 |

FOREIGN PATENT DOCUMENTS

| | | | | |
|---|---|---|---|---|
| DE | 202022103725 U1 * | 8/2022 | | E05F 5/02 |
| WO | WO-2019091968 A1 * | 5/2019 | | E05D 15/40 |

* cited by examiner

*Primary Examiner* — Robert J Utama
(74) *Attorney, Agent, or Firm* — Weaver Austin Villeneuve & Sampson LLP

(57) ABSTRACT

Various features of electronic gaming machines (EGMs) are provided. Some EGMs have a cabinet having a height and a width and defining an internal compartment and an opening, a door rotatably connected to the cabinet, configured to rotate about a hinge axis between a closed position and a first open position, and having a first portion on a first side of the hinge axis and a second portion, smaller than the first portion, on a second side of the hinge axis, a door stay having a first link with a first end and a second end, and a second link with a first end and a second end, and a door stopper connected to the cabinet, positioned in the internal compartment and adjacent to the hinge axis, and having a contact surface extending along an axis parallel to the hinge axis.

20 Claims, 18 Drawing Sheets

SERVER COMPUTERS
CENTRAL DETERMINATION GAMING SYSTEM SERVER
106
TITO SYSTEM SERVER
108
PLAYER TRACKING SYSTEM SERVER
110
PROGRESSIVE SYSTEM SERVER
112
CASINO MANAGEMENT SYSTEM SERVER
114
102
100
104A
104B
104C
104X 264b
274b
258
417
264a
274a
258
270
284b
282b
286b
264c
274c
266
272
284a
280
278
286a
276
282a 486
488
4100
494
484
482
492
498
496
490
4104
420
L1
D1
4102
F
483

ELECTRONIC GAMING MACHINE WITH DOOR, DOOR STAY, AND DOOR STOPPER

RELATED APPLICATION

The present application claims priority to U.S. Provisional Patent Application No. 63/676,183, filed Jul. 26, 2024, and entitled "ELECTRONIC GAMING MACHINE WITH DOOR, DOOR STAY, AND DOOR STOPPER" which is hereby incorporated by reference in its entirety.

BACKGROUND

Electronic gaming machines ("EGMs") or gaming devices provide a variety of wagering games such as slot games, video poker games, video blackjack games, roulette games, video bingo games, keno games and other types of games that are frequently offered at casinos and other locations. Play on EGMs typically involves a player establishing a credit balance by inputting money, or another form of monetary credit, and placing a monetary wager (from the credit balance) on one or more outcomes of an instance (or single play) of a primary or base game. In some cases, a player may qualify for a special mode of the base game, a secondary game, or a bonus round of the base game by attaining a certain winning combination or triggering event in, or related to, the base game, or after the player is randomly awarded the special mode, secondary game, or bonus round. In the special mode, secondary game, or bonus round, the player is given an opportunity to win extra game credits, game tokens or other forms of payout. In the case of "game credits" that are awarded during play, the game credits are typically added to a credit meter total on the EGM and can be provided to the player upon completion of a gaming session or when the player wants to "cash out."

"Slot" type games are often displayed to the player in the form of various symbols arrayed in a row-by-column grid or matrix. Specific matching combinations of symbols along predetermined paths (or paylines) through the matrix indicate the outcome of the game. The display typically highlights winning combinations/outcomes for identification by the player. Matching combinations and their corresponding awards are usually shown in a "pay-table" which is available to the player for reference. Often, the player may vary his/her wager to include differing numbers of paylines and/or the amount bet on each line. By varying the wager, the player may sometimes alter the frequency or number of winning combinations, frequency or number of secondary games, and/or the amount awarded.

Typical games use a random number generator (RNG) to randomly determine the outcome of each game. The game is designed to return a certain percentage of the amount wagered back to the player over the course of many plays or instances of the game, which is generally referred to as return to player (RTP). The RTP and randomness of the RNG ensure the fairness of the games and are highly regulated. Upon initiation of play, the RNG randomly determines a game outcome and symbols are then selected which correspond to that outcome. Notably, some games may include an element of skill on the part of the player and are therefore not entirely random.

Electronic gaming machines are complex devices with display devices and are often housed within cabinets having multiple access points in the form of doors or trays that may be opened or slid out in order to access internal components, cables, connectors, etc.

SUMMARY

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some embodiments, an electronic gaming machine is provided. The electronic gaming machine may have a cabinet having a height and a width and defining an internal compartment and an opening that provides access to the internal compartment, a door rotatably connected to the cabinet, configured to rotate about a hinge axis parallel to the width of the cabinet between a closed position and a first open position, and having a first portion on a first side of the hinge axis and a second portion, smaller than the first portion, on a second side of the hinge axis, a door stay having a first link with a first end and a second end, and a second link with a first end and a second end, and a door stopper connected to the cabinet, positioned in the internal compartment and adjacent to the hinge axis, and having a contact surface extending along an axis parallel to the hinge axis. The first end of the first link may be rotatably connected to the cabinet, the first end of the second link may be rotatably connected to the first portion of the door, the second end of the first link and the second end of the second link may be rotatably connected to each other, in the closed position, the door may cover the opening and an included angle defined by the first link and the second link is acute, and in the first open position the first portion of the door may be outside the internal compartment and away from the opening, the second portion of the door may be inside the internal compartment and in contact with the contact surface of the door stopper, and the included angle defined by the first link and the second link may be a first obtuse angle.

In some embodiments, the door stopper may further have a stationary support structure and a compressible bumper having the contact surface, and in the first open position the compressive bumper may be compressed between the second portion of the door and the stationary support structure.

In some such embodiments, the door may be further configured to rotate between the closed position, the first open position, and a second open position, and in the second open position the included angle defined by the first link and the second link may be a second obtuse angle less than the first obtuse angle, the second portion of the door may be in contact with the contact surface of the compressive bumper, and the compressive bumper may be compressed less than in the first open position.

In some such embodiments, the stationary support structure may be connected to a bottom of the cabinet, may have a horizontal portion extending towards the opening, and in the first open position the compressive bumper may be compressed between the second portion of the door and the horizontal portion of the stationary support structure.

In some such embodiments, the compressive bumper may have a cross-sectional area having a hollow center region.

In some embodiments, the door stopper may further have a stationary support structure having the contact surface, the door may have a compressive bumper, and in the first open position the compressive bumper may be compressed between the second portion of the door and the stationary support structure.

In some embodiments, the door stay may be further configured to have a first overall length and a second overall length longer than the first overall length, and may further have an internal compressive member configured to be compressed while the door stay is at the second overall length more than while the door stay is at the first overall length.

In some such embodiments, the first link or the second link may have an internal chamber that contains a first block, a second block, and the internal compressive member between the first block and the second block, and the internal chamber may be defined by a first link portion of the respective link and a second link portion of the respective link that overlaps with and is slidably connected to the first portion.

In some such embodiments, in the first open position, the door stay may be at the second overall length.

In some embodiments, the door stay may further have a hard stop configured to prevent the included angle defined by the first link and the second link from extending more than about 177 degrees.

In some embodiments, the second portion of the door may have a first width in a direction parallel to the hinge axis, and the contact surface may have a second width in the direction parallel to the hinge axis that is at least 50% of the first width.

In some embodiments, the electronic gaming machine may further have a first piston connected to the first portion and to the cabinet and configured to absorb extension forces.

In some embodiments, the electronic gaming machine may further have a second piston connected to the first portion and to the cabinet and configured to exert a compressive force to shorten the second piston.

In some embodiments, no other door stay may be connected to the door.

In some embodiments, a door stay assembly may be provided. The door stay may have a first link extending along an axis and having a first end and a second end, a first link portion having the first end, a second link portion having the second end, and overlapping with and slidably connected along the axis to the first link portion, an internal chamber at least partially defined by the first link portion and the second link portion, and a first block, a second block, and a compressible member positioned in the internal chamber, and a second link having a first end and a second end. The second end of the first link may be rotatably connected to the second end of the second link, the compressible member may be in between the first block and the second block, the first link may be configured to have a first length and a second length longer than the first length, at the first length, the first block may be offset from the second block by a first distance along the axis, and at the second length the first block may be offset from the second block by a second distance along the axis smaller than the first distance, and the compressible member may be compressed by the first block and the second block.

In some embodiments, the first block may remain stationary relative to the second link portion, and the second block may remain stationary relative to the first link portion.

In some embodiments, the first link portion may have a first groove, the second link portion may have a second groove, and the first link may further have a first pin that extends through the first groove, the first block, and the second link portion, and that is configured to move within the first groove and to remain stationary relative to the second link portion, and a second pin that extends through the second groove, the second block, and the first link portion, and that is configured to move within the second groove and to remain stationary relative to the first link portion.

In some embodiments, at the first length, the compressible member may not be compressed by the first block and the second block.

In some embodiments, the door stay assembly may further have a connecting bracket having a first flange, a second flange opposite the first flange, and a cavity at least partially defined by the first flange and the second flange. The first end of the second link may be positioned within the cavity and rotatably connected to the first flange and the second flange.

In some embodiments, an electronic gaming machine may be provided. The electronic gaming machine may have a cabinet defining an internal compartment and an opening that provides access to the internal compartment, a door rotatably connected to the cabinet and configured to rotate between a closed position and an open position, and a door stay assembly having a first link extending along an axis and having a first end and a second end, a first link portion having the first end, a second link portion having the second end, and overlapping with and slidably connected along the axis to the first link portion, an internal chamber at least partially defined by the first link portion and the second link portion, and a first block, a second block, and a compressible member positioned in the internal chamber, and a second link having a first end and a second end. The second end of the first link may be rotatably connected to the second end of the second link, the first end of the second link may be rotatably connected to the door, the first end of the first link may be rotatably connected to the cabinet, the compressible member may be in between the first block and the second block, the first link may be configured to have a first length and a second length longer than the first length, at the first length, the first block may be offset from the second block by a first distance along the axis, at the second length the first block may be offset from the second block by a second distance along the axis smaller than the first distance, and the compressible member is compressed by the first block and the second block, in the closed position, the first link may have the first length, and in the open position, the first link may have the second length.

Additional aspects will be set forth in the detailed description which follows, and, in part, will be apparent from the disclosure, or may be learned by practice of the disclosed embodiments and/or the claimed subject matter.

The foregoing general description and the following detailed description are illustrative and explanatory and are intended to provide further explanation of the claimed subject matter.

The Figures are provided for the purpose of providing examples and clarity regarding various aspects of this disclosure and are not intended to be limiting.

DETAILED DESCRIPTION

The following discussion provides overall context for electronic gaming machines, some of which may include an enclosure such as those discussed later herein starting with FIG. 4A.

Figure 1:
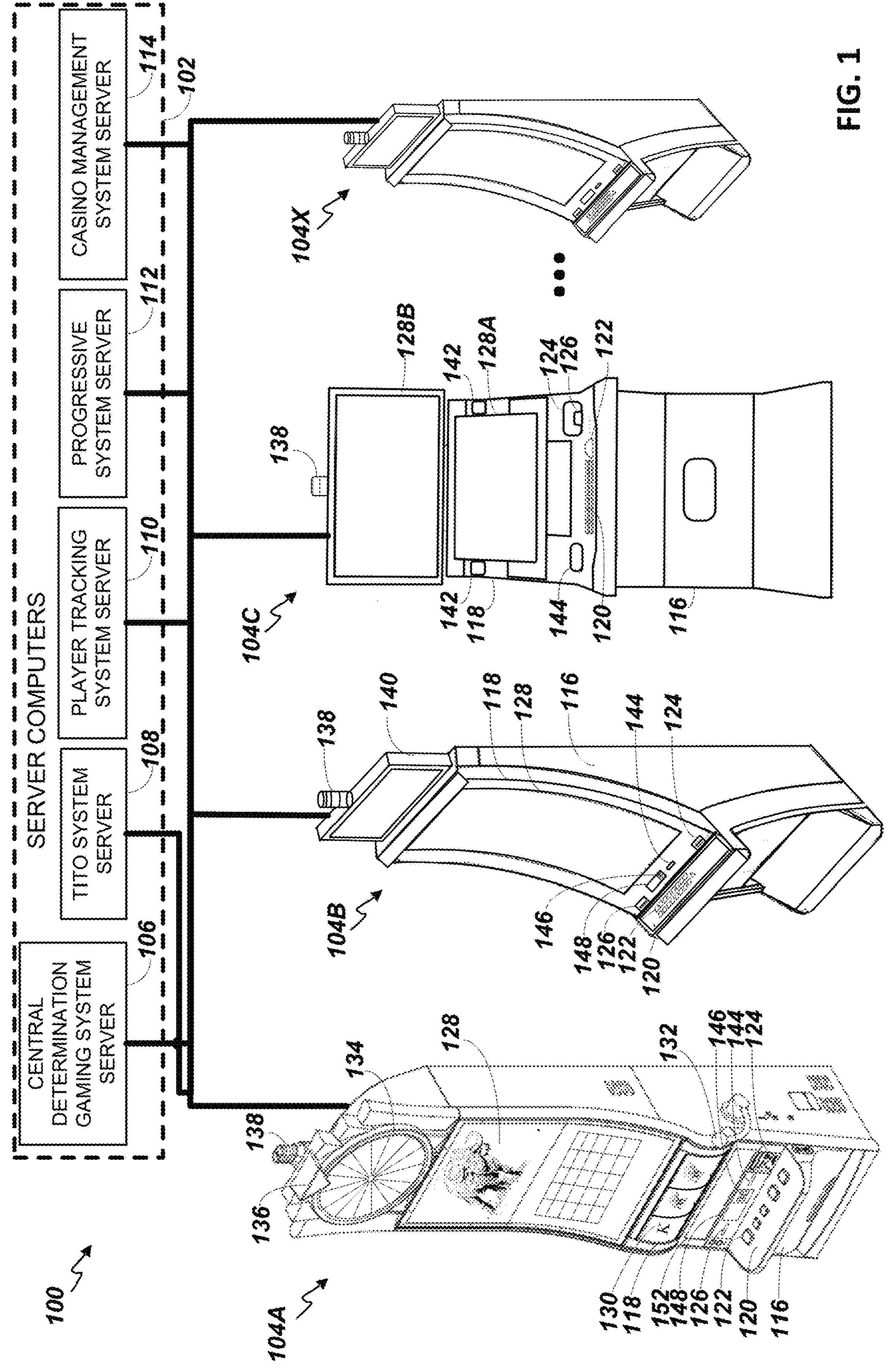
FIG. 1 is an exemplary diagram showing several EGMs networked with various gaming-related servers.

FIG. 1 illustrates several different models of EGMs which may be networked to various gaming-related servers. Shown is a system 100 in a gaming environment including one or more server computers 102 (e.g., slot servers of a casino) that are in communication, via a communications network, with one or more gaming devices 104A-104X (EGMs, slots, video poker, bingo machines, etc.) that can implement one or more aspects of the present disclosure. The gaming devices 104A-104X may alternatively be portable and/or remote gaming devices such as, but not limited to, a smart phone, a tablet, a laptop, or a game console. Gaming devices 104A-104X utilize specialized software and/or hardware to form non-generic, particular machines or apparatuses that comply with regulatory requirements regarding devices used for wagering or games of chance that provide monetary awards.

Communication between the gaming devices 104A-104X and the server computers 102, and among the gaming devices 104A-104X, may be direct or indirect using one or more communication protocols. As an example, gaming devices 104A-104X and the server computers 102 can communicate over one or more communication networks, such as over the Internet through a website maintained by a computer on a remote server or over an online data network including commercial online service providers, Internet service providers, private networks (e.g., local area networks and enterprise networks), and the like (e.g., wide area networks). The communication networks could allow gaming devices 104A-104X to communicate with one another and/or the server computers 102 using a variety of communication-based technologies, such as radio frequency (RF) (e.g., wireless fidelity (WiFi®) and Bluetooth®), cable TV, satellite links and the like.

In some implementations, server computers 102 may not be necessary and/or preferred. For example, in one or more implementations, a stand-alone gaming device such as gaming device 104A, gaming device 104B or any of the other gaming devices 104C-104X can implement one or more aspects of the present disclosure. However, it is typical to find multiple EGMs connected to networks implemented with one or more of the different server computers 102 described herein.

The server computers 102 may include a central determination gaming system server 106, a ticket-in-ticket-out (TITO) system server 108, a player tracking system server 110, a progressive system server 112, and/or a casino management system server 114. Gaming devices 104A-104X may include features to enable operation of any or all servers for use by the player and/or operator (e.g., the casino, resort, gaming establishment, tavern, pub, etc.). For example, game outcomes may be generated on a central determination gaming system server 106 and then transmitted over the network to any of a group of remote terminals or remote gaming devices 104A-104X that utilize the game outcomes and display the results to the players.

Gaming device 104A is often of a cabinet construction which may be aligned in rows or banks of similar devices for placement and operation on a casino floor. The gaming device 104A often includes a main door which provides access to the interior of the cabinet. Gaming device 104A typically includes a button area or button deck 120 accessible by a player that is configured with input switches or buttons 122, an access channel for a bill validator 124, and/or an access channel for a ticket-out printer 126.

In FIG. 1, gaming device 104A is shown as a Relm XL™ model gaming device manufactured by Aristocrat® Technologies, Inc. As shown, gaming device 104A is a reel machine having a gaming display area 118 comprising a number (typically 3 or 5) of mechanical reels 130 with various symbols displayed on them. The mechanical reels 130 are independently spun and stopped to show a set of symbols within the gaming display area 118 which may be used to determine an outcome to the game.

In many configurations, the gaming device 104A may have a main display 128 (e.g., video display monitor) mounted to, or above, the gaming display area 118. The main display 128 can be a high-resolution liquid crystal display (LCD), plasma, light emitting diode (LED), or organic light emitting diode (OLED) panel which may be flat or curved as shown, a cathode ray tube, or other conventional electronically controlled video monitor.

In some implementations, the bill validator 124 may also function as a "ticket-in" reader that allows the player to use a casino issued credit ticket to load credits onto the gaming device 104A (e.g., in a cashless ticket ("TITO") system). In such cashless implementations, the gaming device 104A may also include a "ticket-out" printer 126 for outputting a credit ticket when a "cash out" button is pressed. Cashless TITO systems are used to generate and track unique barcodes or other indicators printed on tickets to allow players to avoid the use of bills and coins by loading credits using a ticket reader and cashing out credits using a ticket-out printer 126 on the gaming device 104A. The gaming device 104A can have hardware meters for purposes including ensuring regulatory compliance and monitoring the player credit balance. In addition, there can be additional meters that record the total amount of money wagered on the gaming device, total amount of money deposited, total amount of money withdrawn, total amount of winnings on gaming device 104A.

In some implementations, a player tracking card reader 144, a transceiver for wireless communication with a mobile device (e.g., a player's smartphone), a keypad 146, and/or an illuminated display 148 for reading, receiving, entering, and/or displaying player tracking information is provided in gaming device 104A. In such implementations, a game controller within the gaming device 104A can communicate with the player tracking system server 110 to send and receive player tracking information.

Gaming device 104A may also include a bonus topper wheel 134. When bonus play is triggered (e.g., by a player achieving a particular outcome or set of outcomes in the primary game), bonus topper wheel 134 is operative to spin and stop with indicator arrow 136 indicating the outcome of the bonus game. Bonus topper wheel 134 is typically used to play a bonus game, but it could also be incorporated into play of the base or primary game.

A candle 138 may be mounted on the top of gaming device 104A and may be activated by a player (e.g., using a switch or one of buttons 122) to indicate to operations staff that gaming device 104A has experienced a malfunction or the player requires service. The candle 138 is also often used to indicate a jackpot has been won and to alert staff that a hand payout of an award may be needed.

There may also be one or more information panels 152 which may be a back-lit, silkscreened glass panel with lettering to indicate general game information including, for example, a game denomination (e.g., $0.25 or $1), pay lines, pay tables, and/or various game related graphics. In some implementations, the information panel(s) 152 may be implemented as an additional video display.

Gaming devices 104A have traditionally also included a handle 132 typically mounted to the side of main cabinet 116 which may be used to initiate game play.

Figure 2A:
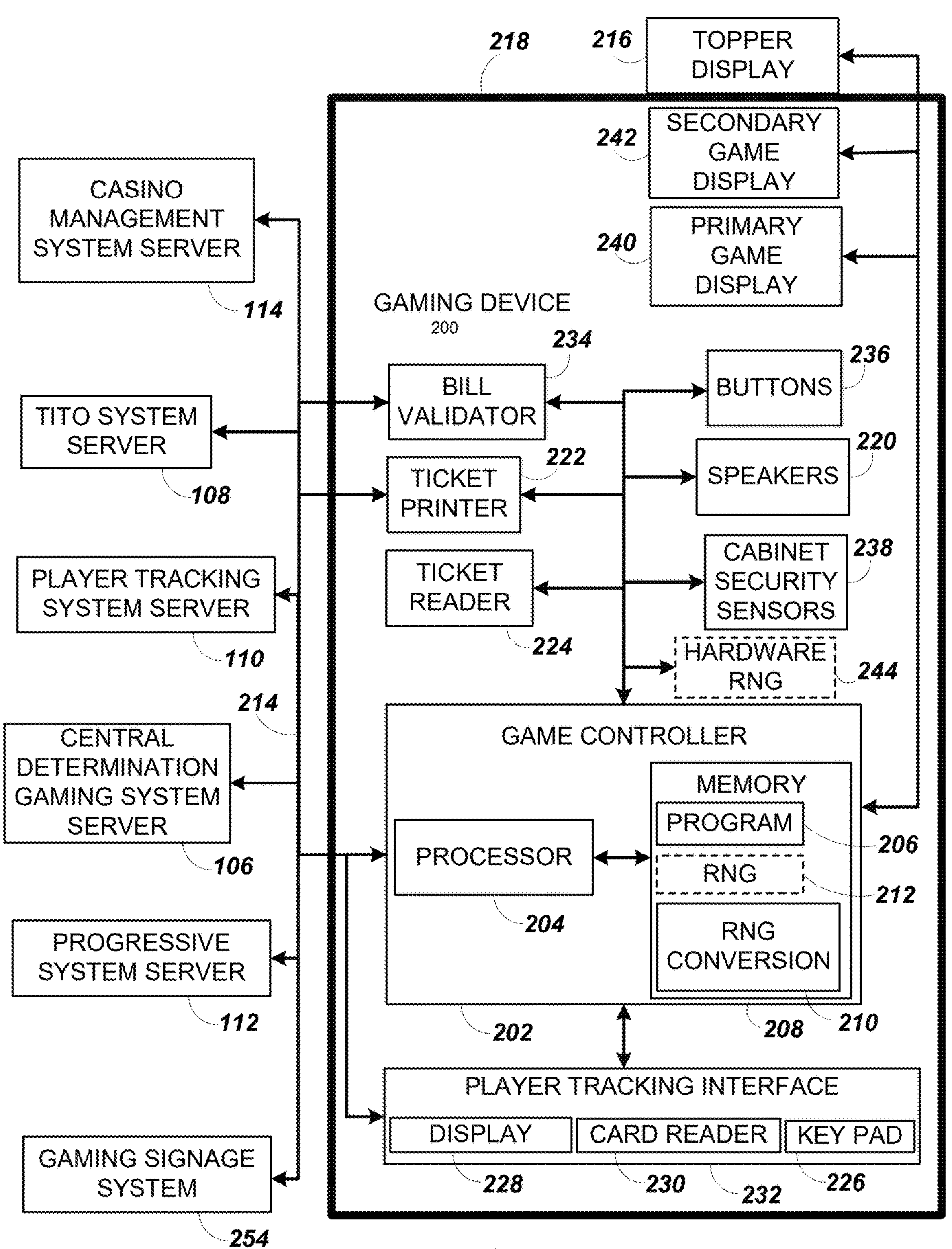
FIG. 2A is a block diagram showing various functional elements of an exemplary EGM.

Many or all the above-described components can be controlled by circuitry (e.g., a game controller) housed inside the main cabinet 116 of the gaming device 104A, the details of which are shown in FIG. 2A.

An alternative example gaming device 104B illustrated in FIG. 1 is the Arc™ model gaming device manufactured by Aristocrat® Technologies, Inc. Note that where possible, reference numerals identifying similar features of the gaming device 104A implementation are also identified in the gaming device 104B implementation using the same reference numbers. Gaming device 104B does not include physical reels and instead shows game play functions on main display 128. An optional topper screen 140 may be used as a secondary game display for bonus play, to show game features or attraction activities while a game is not in play, or any other information or media desired by the game designer or operator. In some implementations, the optional topper screen 140 may also or alternatively be used to display progressive jackpot prizes available to a player during play of gaming device 104B.

Example gaming device 104B includes a main cabinet 116 including a main door which opens to provide access to the interior of the gaming device 104B. The main or service door is typically used by service personnel to refill the ticket-out printer 126 and collect bills and tickets inserted into the bill validator 124. The main or service door may also be accessed to reset the machine, verify and/or upgrade the software, and for general maintenance operations.

Another example gaming device 104C shown is the Helix™ model gaming device manufactured by Aristocrat® Technologies, Inc. Gaming device 104C includes a main display 128A that is in a landscape orientation. Although not illustrated by the front view provided, the main display 128A may have a curvature radius from top to bottom, or alternatively from side to side. In some implementations, main display 128A is a flat panel display. Main display 128A is typically used for primary game play while secondary display 128B is typically used for bonus game play, to show game features or attraction activities while the game is not in play or any other information or media desired by the game designer or operator. In some implementations, example gaming device 104C may also include speakers 142 to output various audio such as game sound, background music, etc.

Many different types of games, including mechanical slot games, video slot games, video poker, video black jack, video pachinko, keno, bingo, and lottery, may be provided with or implemented within the depicted gaming devices 104A-104C and other similar gaming devices. Each gaming device may also be operable to provide many different games. Games may be differentiated according to themes, sounds, graphics, type of game (e.g., slot game vs. card game vs. game with aspects of skill), denomination, number of paylines, maximum jackpot, progressive or non-progressive, bonus games, and may be deployed for operation in Class 2 or Class 3, etc.

FIG. 2A is a block diagram depicting exemplary internal electronic components of a gaming device 200 connected to various external systems. All or parts of the gaming device 200 shown could be used to implement any one of the example gaming devices 104A-X depicted in FIG. 1. As shown in FIG. 2A, gaming device 200 includes a topper display 216 or another form of a top box (e.g., a topper wheel, a topper screen, etc.) that sits above cabinet 218. Cabinet 218 or topper display 216 may also house a number of other components which may be used to add features to a game being played on gaming device 200, including speakers 220, a ticket printer 222 which prints bar-coded tickets or other media or mechanisms for storing or indicating a player's credit value, a ticket reader 224 which reads bar-coded tickets or other media or mechanisms for storing or indicating a player's credit value, and a player tracking interface 232. Player tracking interface 232 may include a keypad 226 for entering information, a player tracking display 228 for displaying information (e.g., an illuminated or video display), a card reader 230 for receiving data and/or communicating information to and from media or a device such as a smart phone enabling player tracking. FIG. 2 also depicts utilizing a ticket printer 222 to print tickets for a TITO system server 108. Gaming device 200 may further include a bill validator 234, player-input buttons 236 for player input, cabinet security sensors 238 to detect unauthorized opening of the cabinet 218, a primary game display 240, and a secondary game display 242, each coupled to and operable under the control of game controller 202.

The games available for play on the gaming device 200 are controlled by a game controller 202 that includes one or more processors 204. Processor 204 represents a general-purpose processor, a specialized processor intended to perform certain functional tasks, or a combination thereof. As an example, processor 204 can be a central processing unit (CPU) that has one or more multi-core processing units and memory mediums (e.g., cache memory) that function as buffers and/or temporary storage for data. Alternatively, processor 204 can be a specialized processor, such as an application specific integrated circuit (ASIC), graphics processing unit (GPU), field-programmable gate array (FPGA), digital signal processor (DSP), or another type of hardware accelerator. In another example, processor 204 is a system on chip (SoC) that combines and integrates one or more general-purpose processors and/or one or more specialized processors. Although FIG. 2A illustrates that game controller 202 includes a single processor 204, game controller 202 is not limited to this representation and instead can include multiple processors 204 (e.g., two or more processors).

FIG. 2A illustrates that processor 204 is operatively coupled to memory 208. Memory 208 is defined herein as including volatile and nonvolatile memory and other types of non-transitory data storage components. Volatile memory is memory that do not retain data values upon loss of power. Nonvolatile memory is memory that do retain data upon a loss of power. Examples of memory 208 include random access memory (RAM), read-only memory (ROM), hard disk drives, solid-state drives, universal serial bus (USB) flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, examples of RAM include static random access memory (SRAM), dynamic random access memory (DRAM), magnetic random access memory (MRAM), and other such devices. Examples of ROM include a programmable read-only memory (PROM), an erasable programmable read-only memory (EPROM), an electrically erasable programmable read-only memory (EEPROM), or other like memory device. Even though FIG. 2A illustrates that game controller 202 includes a single memory 208, game controller 202 could include multiple memories 208 for storing program instructions and/or data.

Memory 208 can store one or more game programs 206 that provide program instructions and/or data for carrying out various implementations (e.g., game mechanics) described herein. Stated another way, game program 206 represents an executable program stored in any portion or component of memory 208. In one or more implementations, game program 206 is embodied in the form of source code that includes human-readable statements written in a programming language or machine code that contains numerical instructions recognizable by a suitable execution system, such as a processor 204 in a game controller or other system. Examples of executable programs include: (1) a compiled program that can be translated into machine code in a format that can be loaded into a random access portion of memory 208 and run by processor 204; (2) source code that may be expressed in proper format such as object code that is capable of being loaded into a random access portion of memory 208 and executed by processor 204; and (3) source code that may be interpreted by another executable program to generate instructions in a random access portion of memory 208 to be executed by processor 204.

Alternatively, game programs 206 can be set up to generate one or more game instances based on instructions and/or data that gaming device 200 exchanges with one or more remote gaming devices, such as a central determination gaming system server 106 (not shown in FIG. 2A but shown in FIG. 1). For purpose of this disclosure, the term "game instance" refers to a play or a round of a game that gaming device 200 presents (e.g., via a user interface (UI)) to a player. The game instance is communicated to gaming device 200 via the network 214 and then displayed on gaming device 200. For example, gaming device 200 may execute game program 206 as video streaming software that allows the game to be displayed on gaming device 200. When a game is stored on gaming device 200, it may be loaded from memory 208 (e.g., from a read only memory (ROM)) or from the central determination gaming system server 106 to memory 208.

Gaming devices, such as gaming device 200, are highly regulated to ensure fairness and, in many cases, gaming device 200 is operable to award monetary awards (e.g., typically dispensed in the form of a redeemable voucher). Therefore, to satisfy security and regulatory requirements in a gaming environment, hardware and software architectures are implemented in gaming devices 200 that differ significantly from those of general-purpose computers. Adapting general purpose computers to function as gaming devices 200 is not simple or straightforward because of: (1) the regulatory requirements for gaming devices 200, (2) the harsh environment in which gaming devices 200 operate, (3) security requirements, (4) fault tolerance requirements, and (5) the requirement for additional special purpose componentry enabling functionality of an EGM. These differences require substantial engineering effort with respect to game design implementation, game mechanics, hardware components, and software.

One regulatory requirement for games running on gaming device 200 generally involves complying with a certain level of randomness. Typically, gaming jurisdictions mandate that gaming devices 200 satisfy a minimum level of randomness without specifying how a gaming device 200 should achieve this level of randomness. To comply, FIG. 2A illustrates that gaming device 200 could include an RNG 212 that utilizes hardware and/or software to generate RNG outcomes that lack any pattern. The RNG operations are often specialized and non-generic in order to comply with regulatory and gaming requirements. For example, in a slot game, game program 206 can initiate multiple RNG calls to RNG 212 to generate RNG outcomes, where each RNG call and RNG outcome corresponds to an outcome for a reel. In another example, gaming device 200 can be a Class II gaming device where RNG 212 generates RNG outcomes for creating Bingo cards. In one or more implementations, RNG 212 could be one of a set of RNGs operating on gaming device 200. More generally, an output of the RNG 212 can be the basis on which game outcomes are determined by the game controller 202. Game developers could vary the degree of true randomness for each RNG (e.g., pseudorandom) and utilize specific RNGs depending on game requirements. The output of the RNG 212 can include a random number or pseudorandom number (either is generally referred to as a "random number").

In FIG. 2A, RNG 212 and hardware RNG 244 are shown in dashed lines to illustrate that RNG 212, hardware RNG 244, or both can be included in gaming device 200. In one implementation, instead of including RNG 212, gaming device 200 could include a hardware RNG 244 that generates RNG outcomes. Analogous to RNG 212, hardware RNG 244 performs specialized and non-generic operations in order to comply with regulatory and gaming requirements. For example, because of regulation requirements, hardware RNG 244 could be a random number generator that securely produces random numbers for cryptography use. The gaming device 200 then uses the secure random numbers to generate game outcomes for one or more game features. In another implementation, the gaming device 200 could include both hardware RNG 244 and RNG 212. RNG 212 may utilize the RNG outcomes from hardware RNG 244 as one of many sources of entropy for generating secure random numbers for the game features.

Another regulatory requirement for running games on gaming device 200 includes ensuring a certain level of RTP. Similar to the randomness requirement discussed above, numerous gaming jurisdictions also mandate that gaming device 200 provides a minimum level of RTP (e.g., RTP of at least 75%). A game can use one or more lookup tables (also called weighted tables) as part of a technical solution that satisfies regulatory requirements for randomness and RTP. In particular, a lookup table can integrate game features (e.g., trigger events for special modes or bonus games; newly introduced game elements such as extra reels, new symbols, or new cards; stop positions for dynamic game elements such as spinning reels, spinning wheels, or shifting reels; or card selections from a deck) with random numbers generated by one or more RNGs, so as to achieve a given level of volatility for a target level of RTP. (In general, volatility refers to the frequency or probability of an event such as a special mode, payout, etc. For example, for a target level of RTP, a higher-volatility game may have a lower payout most of the time with an occasional bonus having a very high payout, while a lower-volatility game has a steadier payout with more frequent bonuses of smaller amounts.) Configuring a lookup table can involve engineering decisions with respect to how RNG outcomes are mapped to game outcomes for a given game feature, while still satisfying regulatory requirements for RTP. Configuring a lookup table can also involve engineering decisions about whether different game features are combined in a given entry of the lookup table or split between different entries (for the respective game features), while still satisfying regulatory requirements for RTP and allowing for varying levels of game volatility.

FIG. 2A illustrates that gaming device 200 includes an RNG conversion engine 210 that translates the RNG outcome from RNG 212 to a game outcome presented to a player. To meet a designated RTP, a game developer can set up the RNG conversion engine 210 to utilize one or more lookup tables to translate the RNG outcome to a symbol element, stop position on a reel strip layout, and/or randomly chosen aspect of a game feature. As an example, the lookup tables can regulate a prize payout amount for each RNG outcome and how often the gaming device 200 pays out the prize payout amounts. The RNG conversion engine 210 could utilize one lookup table to map the RNG outcome to a game outcome displayed to a player and a second lookup table as a pay table for determining the prize payout amount for each game outcome. The mapping between the RNG outcome to the game outcome controls the frequency in hitting certain prize payout amounts.

FIG. 2A also depicts that gaming device 200 is connected over network 214 to player tracking system server 110. Player tracking system server 110 may be, for example, an OASIS® system manufactured by Aristocrat® Technologies, Inc. Player tracking system server 110 is used to track play (e.g., amount wagered, games played, time of play and/or other quantitative or qualitative measures) for individual players so that an operator may reward players in a loyalty program. The player may use the player tracking interface 232 to access his/her account information, activate free play, and/or request various information. Player tracking or loyalty programs seek to reward players for their play and help build brand loyalty to the gaming establishment. The rewards typically correspond to the player's level of patronage (e.g., to the player's playing frequency and/or total amount of game plays at a given casino). Player tracking rewards may be complimentary and/or discounted meals, lodging, entertainment and/or additional play. Player tracking information may be combined with other information that is now readily obtainable by a casino management system.

When a player wishes to play the gaming device 200, he/she can insert cash or a ticket voucher through a coin acceptor (not shown) or bill validator 234 to establish a credit balance on the gaming device. The credit balance is used by the player to place wagers on instances of the game and to receive credit awards based on the outcome of winning instances. The credit balance is decreased by the amount of each wager and increased upon a win. The player can add additional credits to the balance at any time. The player may also optionally insert a loyalty club card into the card reader 230. During the game, the player views with one or more UIs, the game outcome on one or more of the primary game display 240 and secondary game display 242. Other game and prize information may also be displayed.

For each game instance, a player may make selections, which may affect play of the game. For example, the player may vary the total amount wagered by selecting the amount bet per line and the number of lines played. In many games, the player is asked to initiate or select options during course of game play (such as spinning a wheel to begin a bonus round or select various items during a feature game). The player may make these selections using the player-input buttons 236, the primary game display 240 which may be a touch screen, or using some other device which enables a player to input information into the gaming device 200.

During certain game events, the gaming device 200 may display visual and auditory effects that can be perceived by the player. These effects add to the excitement of a game, which makes a player more likely to enjoy the playing experience. Auditory effects include various sounds that are projected by the speakers 220. Visual effects include flashing lights, strobing lights or other patterns displayed from lights on the gaming device 200 or from lights behind the information panel 152 (FIG. 1).

When the player is done, he/she cashes out the credit balance (typically by pressing a cash out button to receive a ticket from the ticket printer 222). The ticket may be "cashed-in" for money or inserted into another machine to establish a credit balance for play.

Additionally, or alternatively, gaming devices 104A-104X and 200 can include or be coupled to one or more wireless transmitters, receivers, and/or transceivers (not shown in FIGS. 1 and 2A) that communicate (e.g., Bluetooth® or other near-field communication technology) with one or more mobile devices to perform a variety of wireless operations in a casino environment. Examples of wireless operations in a casino environment include detecting the presence of mobile devices, performing credit, points, comps, or other marketing or hard currency transfers, establishing wagering sessions, and/or providing a personalized casino-based experience using a mobile application. In one implementation, to perform these wireless operations, a wireless transmitter or transceiver initiates a secure wireless connection between a gaming device 104A-104X and 200 and a mobile device. After establishing a secure wireless connection between the gaming device 104A-104X and 200 and the mobile device, the wireless transmitter or transceiver does not send and/or receive application data to and/or from the mobile device. Rather, the mobile device communicates with gaming devices 104A-104X and 200 using another wireless connection (e.g., WiFi® or cellular network). In another implementation, a wireless transceiver establishes a secure connection to directly communicate with the mobile device. The mobile device and gaming device 104A-104X and 200 sends and receives data utilizing the wireless transceiver instead of utilizing an external network. For example, the mobile device would perform digital wallet transactions by directly communicating with the wireless transceiver. In one or more implementations, a wireless transmitter could broadcast data received by one or more mobile devices without establishing a pairing connection with the mobile devices.

Although FIGS. 1 and 2A illustrate specific implementations of a gaming device (e.g., gaming devices 104A-104X and 200), the disclosure is not limited to those implementations shown in FIGS. 1 and 2. For example, not all gaming devices suitable for implementing implementations of the present disclosure necessarily include top wheels, top boxes, information panels, cashless ticket systems, and/or player tracking systems. Further, some suitable gaming devices have only a single game display that includes only a mechanical set of reels and/or a video display, while others are designed for bar counters or tabletops and have displays that face upwards. Gaming devices 104A-104X and 200 may also include other processors that are not separately shown. Using FIG. 2A as an example, gaming device 200 could include display controllers (not shown in FIG. 2A) configured to receive video input signals or instructions to display images on game displays 240 and 242. Alternatively, such display controllers may be integrated into the game controller 202. The use and discussion of FIGS. 1 and 2 are examples to facilitate ease of description and explanation.

Figure 2B:
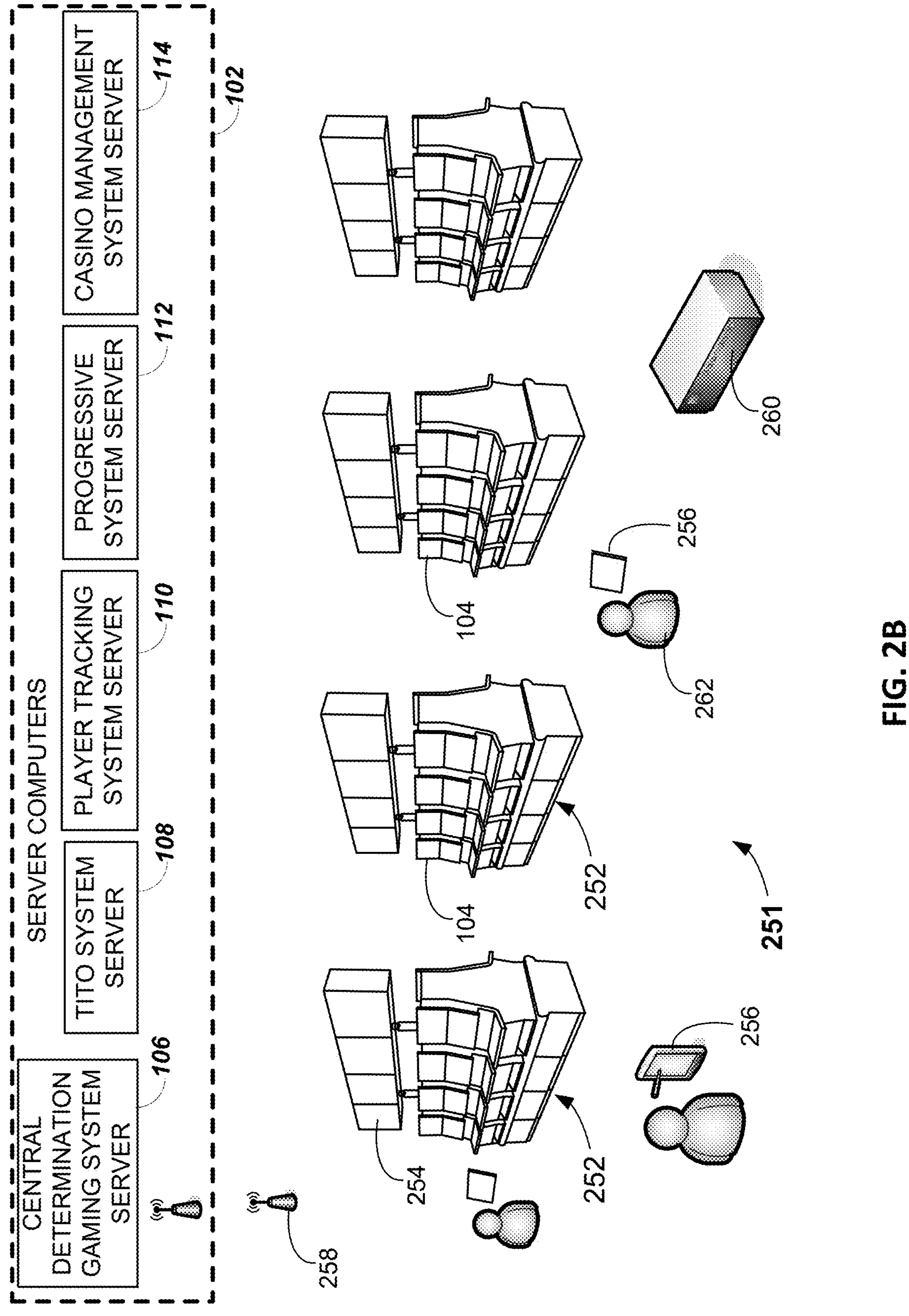
FIG. 2B depicts a casino gaming environment according to one example.

FIG. 2B depicts a casino gaming environment according to one example. In this example, the casino 251 includes banks 252 of EGMs 104. In this example, each bank 252 of EGMs 104 includes a corresponding gaming signage system 254 (also shown in FIG. 2A). According to this implementation, the casino 251 also includes mobile gaming devices 256, which are also configured to present wagering games in this example. The mobile gaming devices 256 may, for example, include tablet devices, cellular phones, smart phones and/or other handheld devices. In this example, the mobile gaming devices 256 are configured for communication with one or more other devices in the casino 251, including but not limited to one or more of the server computers 102, via wireless access points 258.

According to some examples, the mobile gaming devices 256 may be configured for stand-alone determination of game outcomes. However, in some alternative implementations the mobile gaming devices 256 may be configured to receive game outcomes from another device, such as the central determination gaming system server 106, one of the EGMs 104, etc.

Some mobile gaming devices 256 may be configured to accept monetary credits from a credit or debit card, via a wireless interface (e.g., via a wireless payment app), via tickets, via a patron casino account, etc. However, some mobile gaming devices 256 may not be configured to accept monetary credits via a credit or debit card. Some mobile gaming devices 256 may include a ticket reader and/or a ticket printer whereas some mobile gaming devices 256 may not, depending on the particular implementation.

In some implementations, the casino 251 may include one or more kiosks 260 that are configured to facilitate monetary transactions involving the mobile gaming devices 256, which may include cash out and/or cash in transactions. The kiosks 260 may be configured for wired and/or wireless communication with the mobile gaming devices 256. The kiosks 260 may be configured to accept monetary credits from casino patrons 262 and/or to dispense monetary credits to casino patrons 262 via cash, a credit or debit card, via a wireless interface (e.g., via a wireless payment app), via tickets, etc. According to some examples, the kiosks 260 may be configured to accept monetary credits from a casino patron and to provide a corresponding amount of monetary credits to a mobile gaming device 256 for wagering purposes, e.g., via a wireless link such as a near-field communications link. In some such examples, when a casino patron 262 is ready to cash out, the casino patron 262 may select a cash out option provided by a mobile gaming device 256, which may include a real button or a virtual button (e.g., a button provided via a graphical user interface) in some instances. In some such examples, the mobile gaming device 256 may send a "cash out" signal to a kiosk 260 via a wireless link in response to receiving a "cash out" indication from a casino patron. The kiosk 260 may provide monetary credits to the casino patron 262 corresponding to the "cash out" signal, which may be in the form of cash, a credit ticket, a credit transmitted to a financial account corresponding to the casino patron, etc.

In some implementations, a cash-in process and/or a cash-out process may be facilitated by the TITO system server 108. For example, the TITO system server 108 may control, or at least authorize, ticket-in and ticket-out transactions that involve a mobile gaming device 256 and/or a kiosk 260.

Some mobile gaming devices 256 may be configured for receiving and/or transmitting player loyalty information. For example, some mobile gaming devices 256 may be configured for wireless communication with the player tracking system server 110. Some mobile gaming devices 256 may be configured for receiving and/or transmitting player loyalty information via wireless communication with a patron's player loyalty card, a patron's smartphone, etc.

According to some implementations, a mobile gaming device 256 may be configured to provide safeguards that prevent the mobile gaming device 256 from being used by an unauthorized person. For example, some mobile gaming devices 256 may include one or more biometric sensors and may be configured to receive input via the biometric sensor(s) to verify the identity of an authorized patron. Some mobile gaming devices 256 may be configured to function only within a predetermined or configurable area, such as a casino gaming area.

Figure 2C:
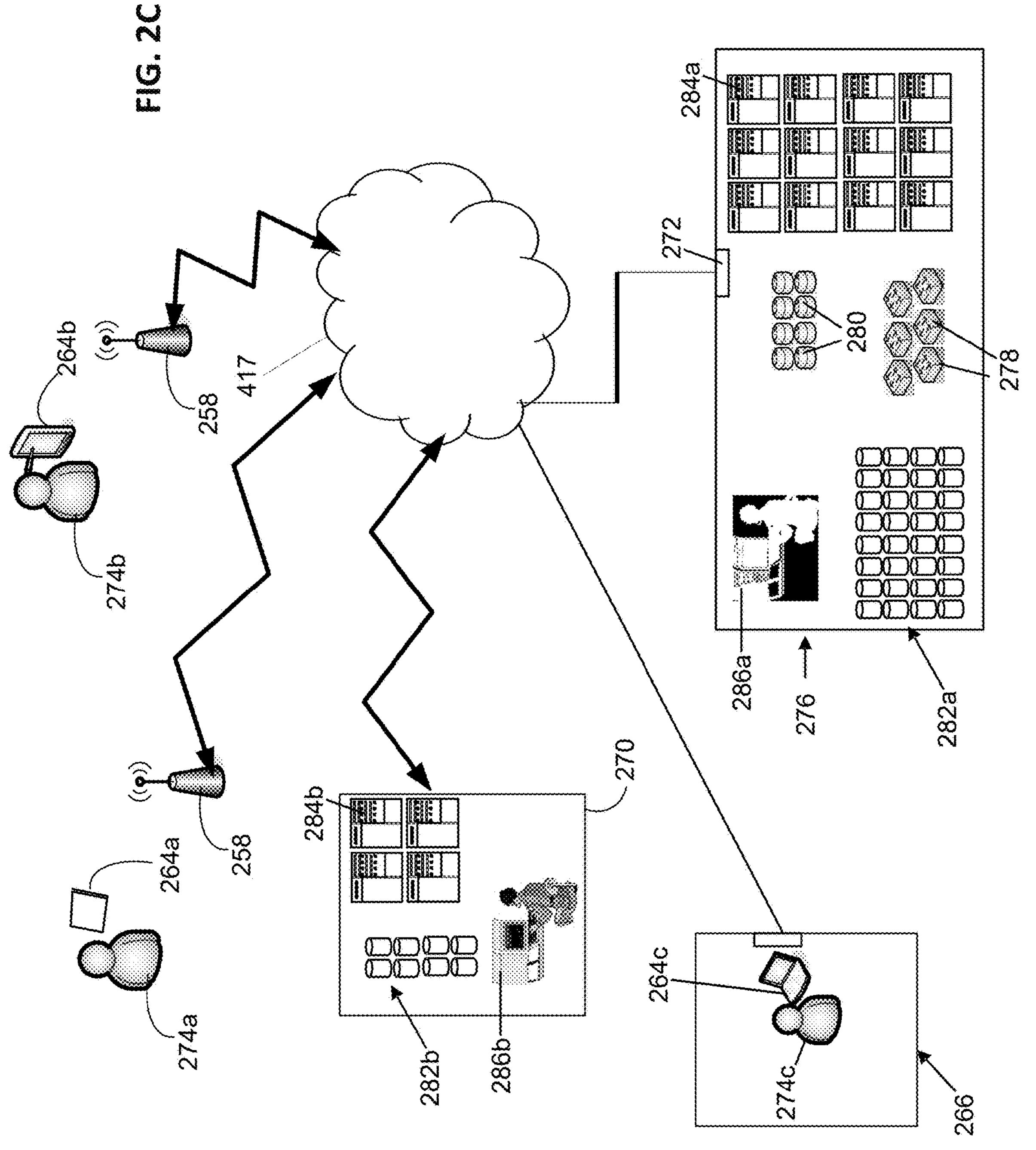
FIG. 2C is a diagram that shows examples of components of a system for providing online gaming according to some aspects of the present disclosure.

FIG. 2C is a diagram that shows examples of components of a system for providing online gaming according to some aspects of the present disclosure. As with other figures presented in this disclosure, the numbers, types and arrangements of gaming devices shown in FIG. 2C are merely shown by way of example. In this example, various gaming devices, including but not limited to end user devices (EUDs) 264*a*, 264*b* and 264*c* are capable of communication via one or more networks 417. The networks 417 may, for example, include one or more cellular telephone networks, the Internet, etc. In this example, the EUDs 264*a* and 264*b* are mobile devices: according to this example the EUD 264*a* is a tablet device and the EUD 264*b* is a smart phone. In this implementation, the EUD 264*c* is a laptop computer that is located within a residence 266 at the time depicted in FIG. 2C. Accordingly, in this example the hardware of EUDs is not specifically configured for online gaming, although each EUD is configured with software for online gaming. For example, each EUD may be configured with a web browser. Other implementations may include other types of EUD, some of which may be specifically configured for online gaming.

In this example, a gaming data center 276 includes various devices that are configured to provide online wagering games via the networks 417. The gaming data center 276 may, for example, be a remote gaming server (RGS) or similar system in some implementations. The gaming data center 276 is capable of communication with the networks 417 via the gateway 272. In this example, switches 278 and routers 280 are configured to provide network connectivity for devices of the gaming data center 276, including storage devices 282*a,* servers 284*a* and one or more workstations 286*b*. The servers 284*a* may, for example, be configured to provide access to a library of games for online game play. In some examples, code for executing at least some of the games may initially be stored on one or more of the storage devices 282*a*. The code may be subsequently loaded onto a server 284*a* after selection by a player via an EUD and communication of that selection from the EUD via the networks 417. The server 284*a* onto which code for the selected game has been loaded may provide the game according to selections made by a player and indicated via the player's EUD. In other examples, code for executing at least some of the games may initially be stored on one or more of the servers 284*a*. Although only one gaming data center 276 is shown in FIG. 2C, some implementations may include multiple gaming data centers 276.

In this example, a financial institution data center 270 is also configured for communication via the networks 417. Here, the financial institution data center 270 includes servers 284*b,* storage devices 282*b,* and one or more workstations 286*b*. According to this example, the financial institution data center 270 is configured to maintain financial accounts, such as checking accounts, savings accounts, loan accounts, etc. In some implementations one or more of the authorized users 274*a*-274*c* may maintain at least one financial account with the financial institution that is serviced via the financial institution data center 270.

According to some implementations, the gaming data center 276 may be configured to provide online wagering games in which money may be won or lost. According to some such implementations, one or more of the servers 284*a* may be configured to monitor player credit balances, which may be expressed in game credits, in currency units, or in any other appropriate manner. In some implementations, the server(s) 284*a* may be configured to obtain financial credits from and/or provide financial credits to one or more financial institutions, according to a player's "cash in" selections, wagering game results and a player's "cash out" instructions. According to some such implementations, the server(s) 284*a* may be configured to electronically credit or debit the account of a player that is maintained by a financial institution, e.g., an account that is maintained via the financial institution data center 270. The server(s) 284*a* may, in some examples, be configured to maintain an audit record of such transactions.

In some alternative implementations, the gaming data center 276 may be configured to provide online wagering games for which credits may not be exchanged for cash or the equivalent. In some such examples, players may purchase game credits for online game play, but may not "cash out" for monetary credit after a gaming session. Moreover, although the financial institution data center 270 and the gaming data center 276 include their own servers and storage devices in this example, in some examples the financial institution data center 270 and/or the gaming data center 276 may use offsite "cloud-based" servers and/or storage devices. In some alternative examples, the financial institution data center 270 and/or the gaming data center 276 may rely entirely on cloud-based servers.

One or more types of devices in the gaming data center 276 (or elsewhere) may be capable of executing middleware, e.g., for data management and/or device communication.

Authentication information, player tracking information, etc., including but not limited to information obtained by EUDs 264 and/or other information regarding authorized users of EUDs 264 (including but not limited to the authorized users 274*a*-274*c*), may be stored on storage devices 282 and/or servers 284. Other game-related information and/or software, such as information and/or software relating to leaderboards, players currently playing a game, game themes, game-related promotions, game competitions, etc., also may be stored on storage devices 282 and/or servers 284. In some implementations, some such game-related software may be available as "apps" and may be downloadable (e.g., from the gaming data center 276) by authorized users.

In some examples, authorized users and/or entities (such as representatives of gaming regulatory authorities) may obtain gaming-related information via the gaming data center 276. One or more other devices (such EUDs 264 or devices of the gaming data center 276) may act as intermediaries for such data feeds. Such devices may, for example, be capable of applying data filtering algorithms, executing data summary and/or analysis software, etc. In some implementations, data filtering, summary and/or analysis software may be available as "apps" and downloadable by authorized users.

Figure 3:
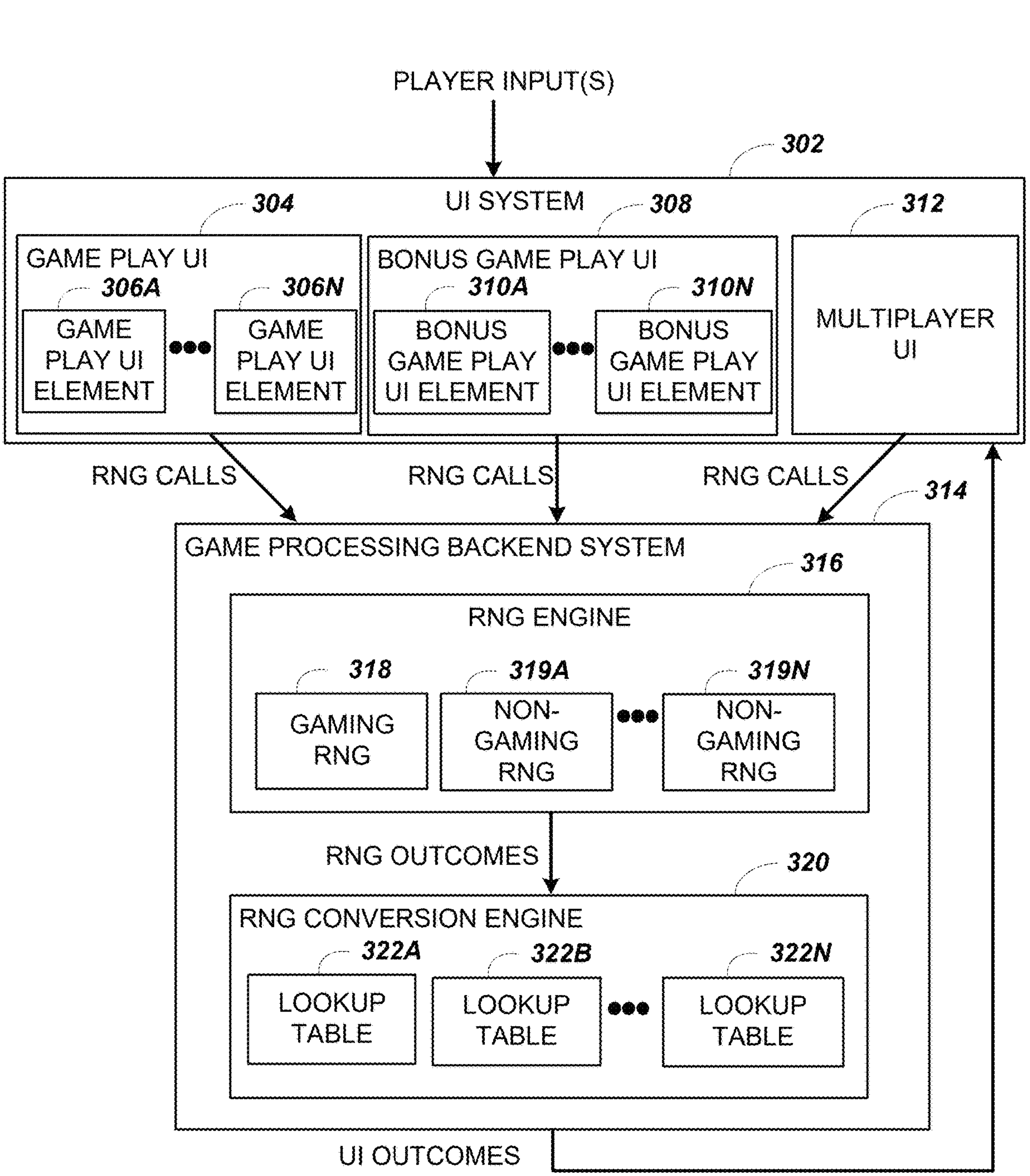
FIG. 3 illustrates, in block diagram form, an implementation of a game processing architecture algorithm that implements a game processing pipeline for the play of a game in accordance with various implementations described herein.

FIG. 3 illustrates, in block diagram form, an implementation of a game processing architecture 300 that implements a game processing pipeline for the play of a game in accordance with various implementations described herein. As shown in FIG. 3, the gaming processing pipeline starts with having a UI system 302 receive one or more player inputs for the game instance. Based on the player input(s), the UI system 302 generates and sends one or more RNG calls to a game processing backend system 314. Game processing backend system 314 then processes the RNG calls with RNG engine 316 to generate one or more RNG outcomes. The RNG outcomes are then sent to the RNG conversion engine 320 to generate one or more game outcomes for the UI system 302 to display to a player. The game processing architecture 300 can implement the game processing pipeline using a gaming device, such as gaming devices 104A-104X and 200 shown in FIGS. 1 and 2, respectively. Alternatively, portions of the gaming processing architecture 300 can implement the game processing pipeline using a gaming device and one or more remote gaming devices, such as central determination gaming system server 106 shown in FIG. 1.

The UI system 302 includes one or more UIs that a player can interact with. The UI system 302 could include one or more game play UIs 304, one or more bonus game play UIs 308, and one or more multiplayer UIs 312, where each UI type includes one or more mechanical UIs and/or graphical UIs (GUIs). In other words, game play UI 304, bonus game play UI 308, and the multiplayer UI 312 may utilize a variety of UI elements, such as mechanical UI elements (e.g., physical "spin" button or mechanical reels) and/or GUI elements (e.g., virtual reels shown on a video display or a virtual button deck) to receive player inputs and/or present game play to a player. Using FIG. 3 as an example, the different UI elements are shown as game play UI elements 306A-306N and bonus game play UI elements 310A-310N.

The game play UI 304 represents a UI that a player typically interfaces with for a base game. During a game instance of a base game, the game play UI elements 306A-306N (e.g., GUI elements depicting one or more virtual reels) are shown and/or made available to a user. In a subsequent game instance, the UI system 302 could transition out of the base game to one or more bonus games. The bonus game play UI 308 represents a UI that utilizes bonus game play UI elements 310A-310N for a player to interact with and/or view during a bonus game. In one or more implementations, at least some of the game play UI element 306A-306N are similar to the bonus game play UI elements 310A-310N. In other implementations, the game play UI element 306A-306N can differ from the bonus game play UI elements 310A-310N.

FIG. 3 also illustrates that UI system 302 could include a multiplayer UI 312 purposed for game play that differs or is separate from the typical base game. For example, multiplayer UI 312 could be set up to receive player inputs and/or presents game play information relating to a tournament mode. When a gaming device transitions from a primary game mode that presents the base game to a tournament mode, a single gaming device is linked and synchronized to other gaming devices to generate a tournament outcome. For example, multiple RNG engines 316 corresponding to each gaming device could be collectively linked to determine a tournament outcome. To enhance a player's gaming experience, tournament mode can modify and synchronize sound, music, reel spin speed, and/or other operations of the gaming devices according to the tournament game play. After tournament game play ends, operators can switch back the gaming device from tournament mode to a primary game mode to present the base game. Although FIG. 3 does not explicitly depict that multiplayer UI 312 includes UI elements, multiplayer UI 312 could also include one or more multiplayer UI elements.

Based on the player inputs, the UI system 302 could generate RNG calls to a game processing backend system 314. As an example, the UI system 302 could use one or more application programming interfaces (APIs) to generate the RNG calls. To process the RNG calls, the RNG engine 316 could utilize gaming RNG 318 and/or non-gaming RNGs 319A-319N. Gaming RNG 318 could corresponds to RNG 212 or hardware RNG 244 shown in FIG. 2A. As previously discussed with reference to FIG. 2A, gaming RNG 318 often performs specialized and non-generic operations that comply with regulatory and/or game requirements. For example, because of regulation requirements, gaming RNG 318 could correspond to RNG 212 by being a cryptographic RNG or pseudorandom number generator (PRNG) (e.g., Fortuna PRNG) that securely produces random numbers for one or more game features. To securely generate random numbers, gaming RNG 318 could collect random data from various sources of entropy, such as from an operating system (OS) and/or a hardware RNG (e.g., hardware RNG 244 shown in FIG. 2A). Alternatively, non-gaming RNGs 319A-319N may not be cryptographically secure and/or be computationally less expensive. Non-gaming RNGs 319A-319N can, thus, be used to generate outcomes for non-gaming purposes. As an example, non-gaming RNGs 319A-319N can generate random numbers for generating random messages that appear on the gaming device.

The RNG conversion engine 320 processes each RNG outcome from RNG engine 316 and converts the RNG outcome to a UI outcome that is feedback to the UI system 302. With reference to FIG. 2A, RNG conversion engine 320 corresponds to RNG conversion engine 210 used for game play. As previously described, RNG conversion engine 320 translates the RNG outcome from the RNG 212 to a game outcome presented to a player. RNG conversion engine 320 utilizes one or more lookup tables 322A-322N to regulate a prize payout amount for each RNG outcome and how often the gaming device pays out the derived prize payout amounts. In one example, the RNG conversion engine 320 could utilize one lookup table to map the RNG outcome to a game outcome displayed to a player and a second lookup table as a pay table for determining the prize payout amount for each game outcome. In this example, the mapping between the RNG outcome and the game outcome controls the frequency in hitting certain prize payout amounts. Different lookup tables could be utilized depending on the different game modes, for example, a base game versus a bonus game.

After generating the UI outcome, the game processing backend system 314 sends the UI outcome to the UI system 302. Examples of UI outcomes are symbols to display on a video reel or reel stops for a mechanical reel. In one example, if the UI outcome is for a base game, the UI system 302 updates one or more game play UI elements 306A-306N, such as symbols, for the game play UI 304. In another example, if the UI outcome is for a bonus game, the UI system could update one or more bonus game play UI elements 310A-310N (e.g., symbols) for the bonus game play UI 308. In response to updating the appropriate UI, the player may subsequently provide additional player inputs to initiate a subsequent game instance that progresses through the game processing pipeline.

Electronic gaming machines (EGMs) such as those discussed above may have cabinets with access panels, doors, slide-out trays, or separate enclosures (e.g., a bill validator cage) within the cabinet. The cabinet of some EGMs has a door to which one or more display devices and other components, such as button decks and bill validators, are mounted. Some of these doors may be configured to open outward and downward by rotating about a hinge axis located towards a bottom portion of the door. Bottom may mean relatively closer to the floor or ground on which the electronic gaming machine is, or is configured to be, directly or indirectly positioned. While having doors open outwards and downwards with multiple heavy devices, e.g., one or more display devices, pieces of glass, locks, electronics, and other components, may be required and/or advantageous, such configuration creates numerous challenges. For example, the door's momentum created about the hinge axis during opening can be significant and without features configured to arrest the door's rotational movement, the cabinet, door, and its equipment can be damaged. Further, creating such features may be made more difficult by some EMGs having size, clearance, and other operational constraints that limit the space and operational envelope for such features. For instance, an EGM may have a cabinet with an opening and a door for that opening that opens outwards and downwards, and the area of the cabinet and the opening that can be used for movement and features of the door may be significantly limited. This may include the inability to use multiple door stays on multiple sides of the door. Additionally, the cabinet of the electronic gaming machine may provide limited structural support for individual elements of the door.

Provided herein are new and novel features for a door of electronic gaming machines. Some embodiments provide an electronic gaming machine with a cabinet having an internal compartment, an opening, and a door providing access to the internal cabinet through the opening. The door is rotatably connected to the cabinet at a hinge axis at a lower portion of the door and is configured to open by rotating outwards and downwards. The embodiments provided herein have one or more features configured to stop the rotational movement of the door, such as a door stopper, a single door stay, or both. In some implementations, the door stopper is positioned in the cabinet and configured to be contacted by a lower portion of the door during the door's rotational movement and configured to stop the rotation of the door. The door stopper may include a compressible bumper that is configured to be compressed by the door and thereby absorb some of the movement and impulse momentum of the door. Aside from the compressible bumper, the door stopper is configured to remain stationary with respect to the door and cabinet.

In some implementations, the single door stay is rotatably connected to the cabinet and to the door, and configured to provide a hard stop for the door. An included angle between a first link and a second link of the door stay may be acute while the door is in a closed position, and may be obtuse while the door is in a fully open position. In some instances, the included angle may be obtuse and not 180 degrees when the door first contacts the door stopper, and may reach 180 degrees, or another hard stop angle, once the door has made some compression of the compressible bumper. In some implementations, the door stay may have an internal compressible member within an internal chamber of one of its links to provide additional dampening and force absorption. The internal chamber may be at least partially defined by first and second portions of the respective link that overlap each other and are slidably connected to each other. Inside the internal chamber may be a compressible member, e.g., a polyurethane block, in between two blocks. As the weight and momentum of the door is exerted on the door stay during opening, this axial force pulls the two portions of the respective link in opposite directions away from each other which increases the length of the link and door stay, and causes the blocks to move towards each other inside the internal chamber and compress the compressible member. This compression thereby provides some shock absorption of the axial force exerted on the door stay.

Figure 4A:
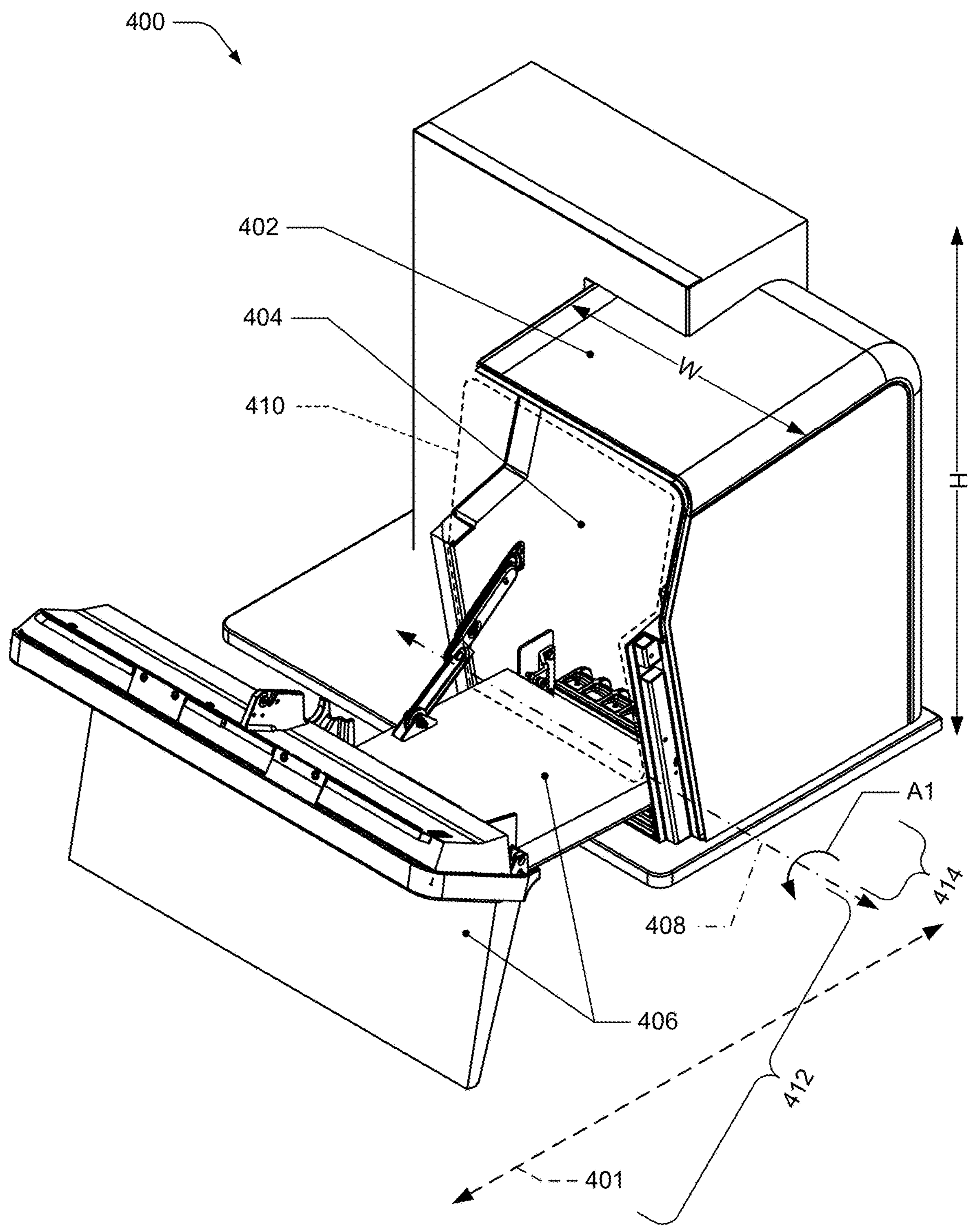
FIG. 4A depicts an isometric view of an electronic gaming machine according to disclosed embodiments.

FIG. 4A depicts an isometric view of an electronic gaming machine according to disclosed embodiments. The electronic gaming machine (EGM) 400 has a cabinet 402 having a height H and a width W and defining an internal compartment 404 which may be considered an area of the inside of the cabinet 402. The cabinet 402 also has door 406 rotatably connected to the cabinet 402 and partially encompassed by the dashed shape. The door 406 is configured to rotate about a hinge axis 408 that is located towards a bottom portion of the door 406 which may also be located towards the bottom of the cabinet 402, as depicted. In some implementations, like here, the door 406 is configured to open outwards and downwards towards the floor 401 as indicated by the arrow A1. The floor may be considered an omnibus term for the floor, ground, or other support structure on which the EGM is directly or indirectly positioned. For example, many EGMs are positioned on the floor, or on a support structure (e.g., an EGM stand) on the floor, of a casino or other location.

Figure 4B:
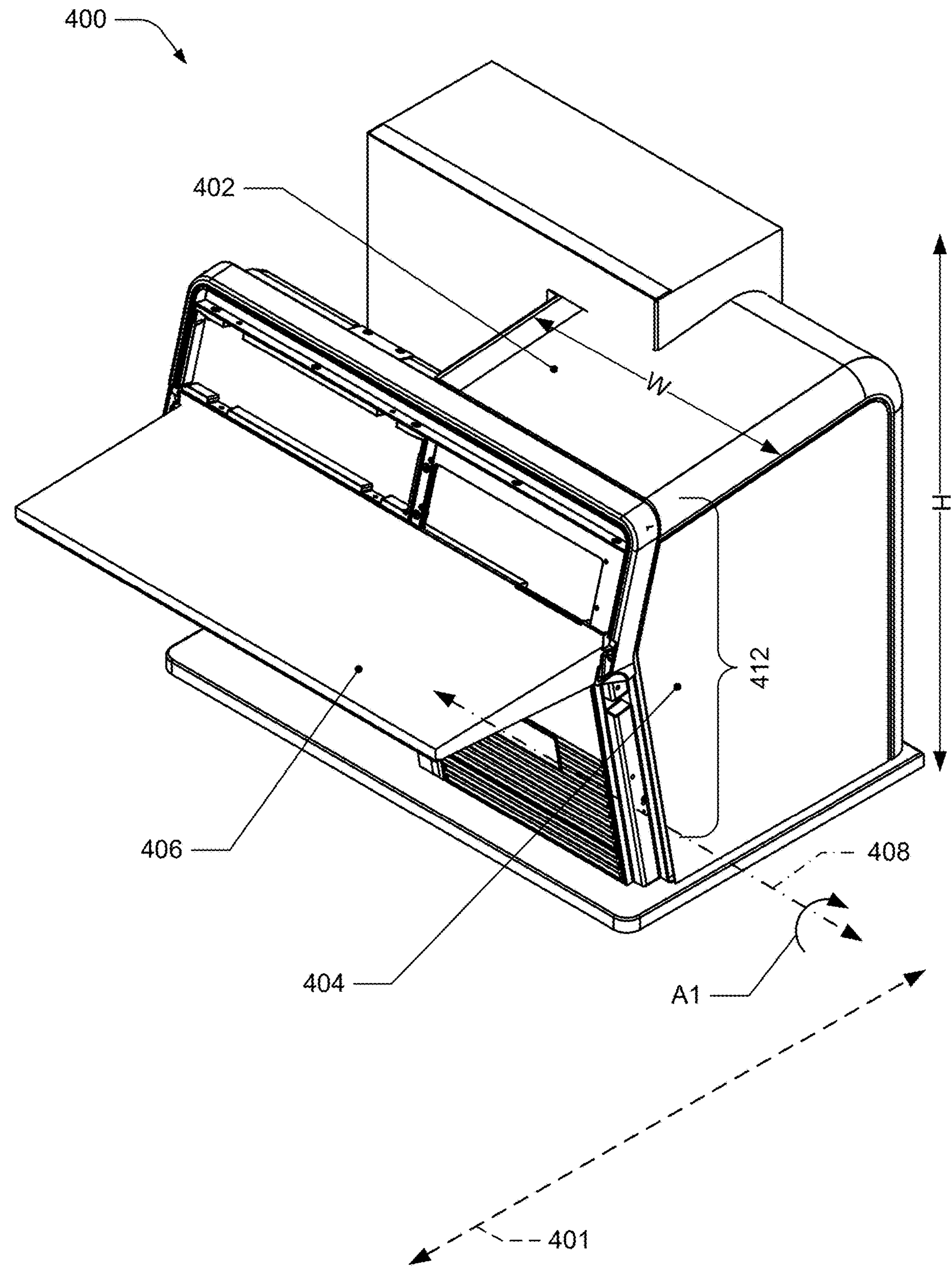
FIG. 4B depicts the electronic gaming machine of FIG. 4A with the door in a closed position according to various embodiments.

The cabinet 402 also has an opening 410 through which access can be made into the internal compartment 404 for various reasons. This may include maintenance, service, removing components like a cashbox or electronics, etc. During normal operations of EGM 400, the opening 410 is covered by the door 406 and access is prevented to the internal compartment 404. To provide and restrict access to the internal compartment 404, the door 406 is configured to rotate about the hinge axis 408 between a closed position and one or more open positions. FIG. 4A depicts the door 406 in the open position and FIG. 4B depicts the electronic gaming machine of FIG. 4A with the door in a closed position according to various embodiments. As illustrated in these Figures, when the door 406 is in the open position, the opening 410 is uncovered and access to the internal compartment 404 is provided through the opening 410; while in the closed position, the door 406 covers the opening 410 of the cabinet 402 and the internal compartment 404 is not accessible through the opening 410.

In FIG. 4A, the door may be considered in a first open position. The door 406 has been rotated about the hinge axis 408 outwards from the opening 410 such that the door 406 does not cover the opening 410. As described in more detail below, the door 406 has a first portion 412 on one side of the hinge axis 408 and a second portion 414 smaller than the first portion 412 and on the other side of the hinge axis 408. When in the first open position as illustrated in FIG. 4A, the first portion 412 is outside the cabinet 402, away from the opening 410, and not covering the opening 410, while the second portion 414 is positioned inside the internal compartment 404 of the cabinet 402. In FIG. 4B, when the door 406 is in the closed position, the door 406, including the first portion 412, covers the opening 410. In some instances, the second portion 414 may cover some of the opening 410 when the door is in the closed position as illustrated in FIG. 4B.

As mentioned, various designs, requirements, and constraints give rise to numerous challenges in configuring EGM doors. For example, some doors have shapes and other features that make the door heavy and/or place the center of gravity of the door far from the hinge axis. Some constraints may also require that the door's rotational arc be within a particular range such that it does not open too far and strike other components or objects, and may limit the space within the cabinet that can accommodate door-related features. Some embodiments provided herein have a door with a single door stay, a door stopper, or both. The door stay may have two links and be configured to provide a hard stop for the door thereby preventing the door from rotating past a particular rotational arc or point. The door stopper may also be configured to provide a hard stop for the door and provide shock absorption, in some implementations. Some of the EGMs provided herein may only have one door stay because various constraints may limit the ability to have two door stays. With such limitation to a single door stay, other features like the door stopper may be used to provide adequate support and control of the door.

Figure 5:
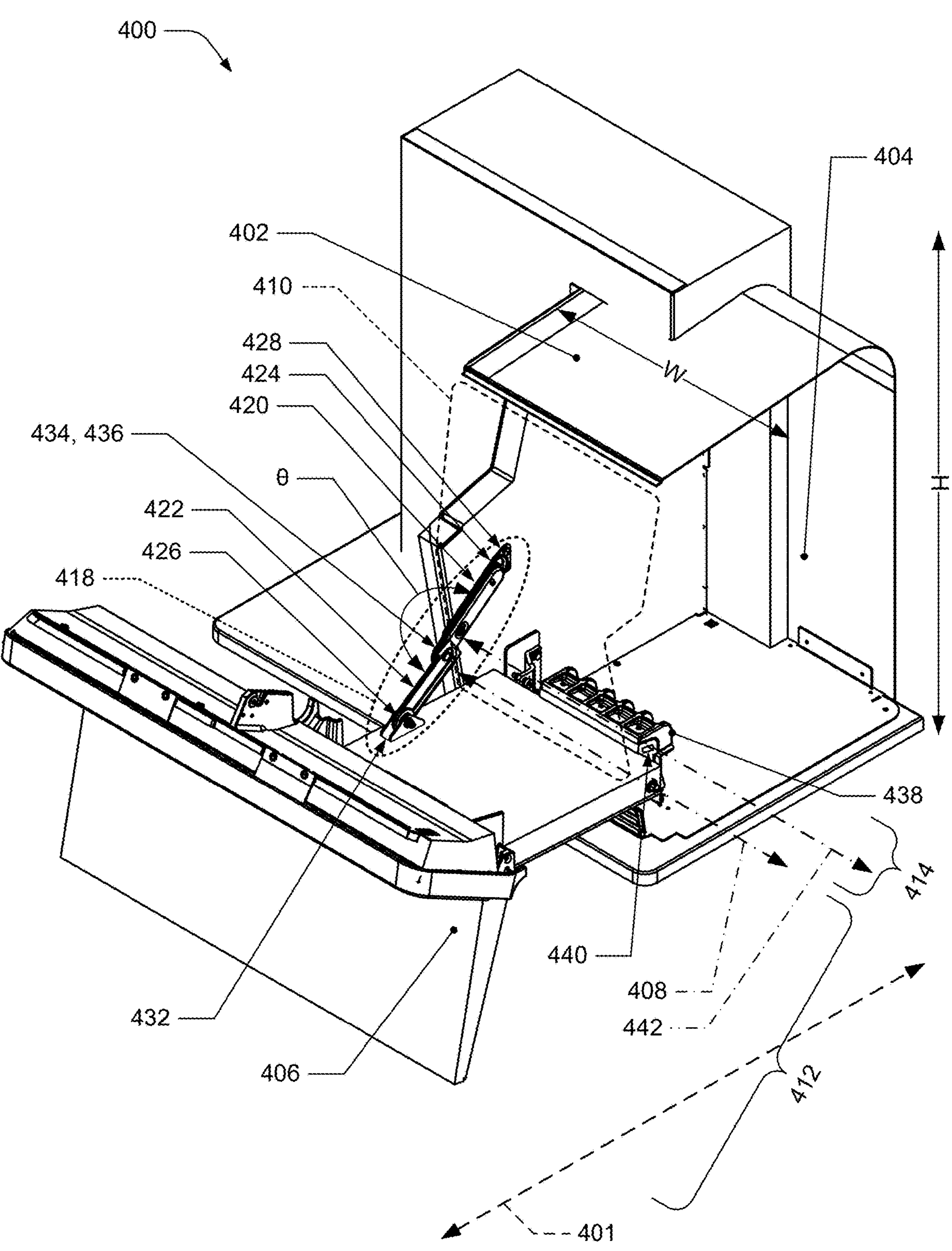
FIG. 5 depicts an off-angle view of the electronic gaming machine of FIG. 4A with a side panel removed, according to various embodiments.
Figure 6:
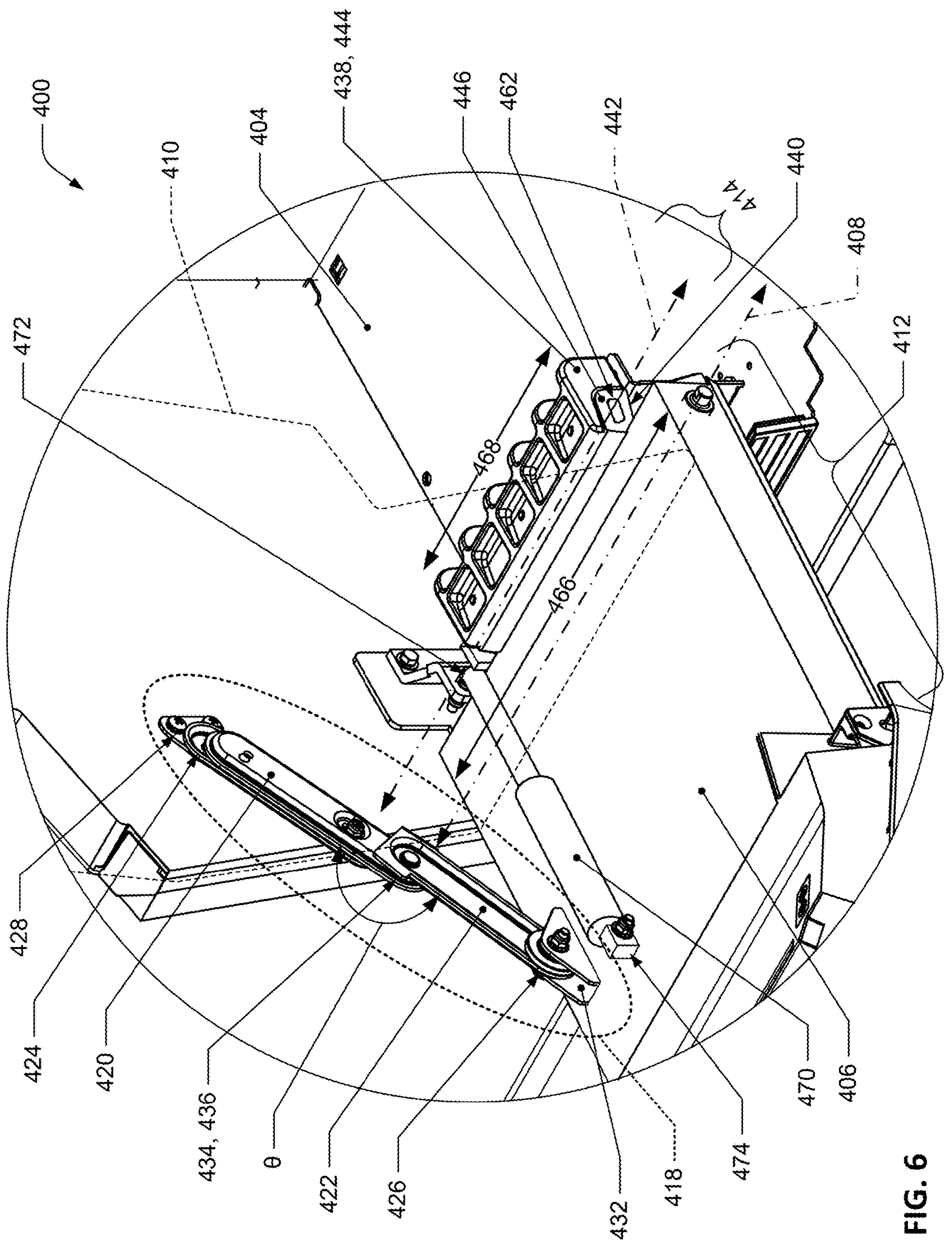
FIG. 6 depicts a magnified portion of FIG. 5, according to disclosed embodiments.

FIG. 5 depicts an off-angle view of the electronic gaming machine of FIG. 4A with a side panel removed, according to various embodiments. FIG. 6 depicts a magnified portion of FIG. 5, according to disclosed embodiments, and provides additional clarity. Here in these two Figures, aspects of the internal compartment 404 and the EGM 400 are visible with a side of the cabinet 402 removed. The EGM 400 has a door stay 418 (encircled by the dotted ellipse) with two links, a first link 420 and a second link 422. As provided herein, in some implementations, the EGM 400 has only one door stay 418 for the door 406. A first end 424 of the first link 420 is rotatably connected to the cabinet 402 and a first end 426 of the second link 422 is rotatably connected to the first portion 412 of the door 406. These rotational connections provide for the first link 420 to rotate at the first end 424 with respect to the cabinet 402 and the second link 422 to rotate at its first end 426 with respect to the door 406. The rotational connections may be made with pins and brackets in some implementations.

For example, as shown in FIG. 5 and more visible in FIG. 6, the door stay 418 has a first bracket 428 secured or fixed to the cabinet 402 and the first end 424 of the first link 420 is connected to the first bracket 428 via a rotational connection which may be a pin extending through the first bracket 428 and first end 424 such that the first link 420 can rotate about the pin. Similarly, the door stay 418 has a second bracket 432 secured or fixed to the door 406 and the first end 426 of the second link 422 is connected to the second bracket 432 via a rotational connection which may be a pin extending through the second bracket 432 and the first end 426 such that the second link 422 can rotate about the pin. In some implementations, the first bracket 428 may be considered a shoulder for the door stay 418 and the second bracket 432 may be considered a wrist for the door stay 418. As further illustrated in FIG. 5, the first link 420 has a second end 434, the second link 422 has a second end 436, and the second end 434 of the first link 420 and the second end 436 of the second link 422 are rotatably connected to each other thereby configuring the first and second links 420 and 422 to rotate with respect to each other.

The first link 420 and the second link 422 together define an included angle θ. In the first open position of FIGS. 4A, 5 and 6, the included angle θ between the first and second links 420 and 422 is obtuse such that it is greater than 90 degrees and less than 180 degrees. The obtuse included angle θ may be advantageous in some embodiments because with the included angle θ of the door stay 418 at or greater than 180 degrees, it may be difficult or infeasible to close the door. In some other implementations, the included angle may be greater than obtuse, such as between 180 degrees and 185 degrees, in some instances. The door stay 418 is also configured to stop the rotational movement of the door 406 individually and together with, e.g., concurrently with, the door stopper 438. Additional or alternative features of the door stay 418 are provided farther below.

Also visible in FIGS. 5 and 6 is a door stopper 438 that is connected to the cabinet 402, positioned inside the internal compartment 404, and adjacent to the hinge axis 408. The door stopper 438 has a contact surface 440 that extends along an axis 442 that is parallel to the hinge axis 408. As identified in FIG. 6, the door stopper 438 is comprised of a stationary support structure 444 and a compressible bumper 446 that has the contact surface 440. In the first open position of FIGS. 4A, 5, and 6, the second portion 414 of the door 406 is inside the internal compartment 404, in contact with the contact surface 440, and at least partially compressing the compressible bumper 446. The compressible bumper 446 may be made of an elastically deformable material, such as a rubber or flexible polymer, that can be deformed by the door 406 and elastically return to its original shape. This compressibility can provide shock absorption for the door when it contacts the door stopper 438 which can reduce the forces exerted on the door stay 418 and the cabinet 402 during opening. In some other embodiments, the compressible bumper may be fixed to the door 406 instead of to the stationary support structure 444, and the contact surface may be on the stationary support structure 444 of the door stopper 438. In any of these embodiments, the compressible bumper 446 is compressed between the door 406 and the stationary support structure 444 of the door stopper 438. Similar to the door stay 418, the door stopper 438 is configured to stop the rotational movement of the door 406 individually and together with, e.g., concurrently with, the door stay 418.

As further shown in FIG. 6, in some embodiments, the second portion 414 of the door 406 has first width 466 in a direction parallel to the hinge axis 408. The door stopper 438 may have a second width 468 in the direction parallel to the hinge axis 408. In some implementations, the second width 468 may be at least 50%, 75%, or 90% of the first width 466. In some such implementations, the first and second width 466 and 468 may be the same. Such configurations may provide support for the door stopper's ability to stop the door and absorb the rotational movement of the door.

Figure 7:
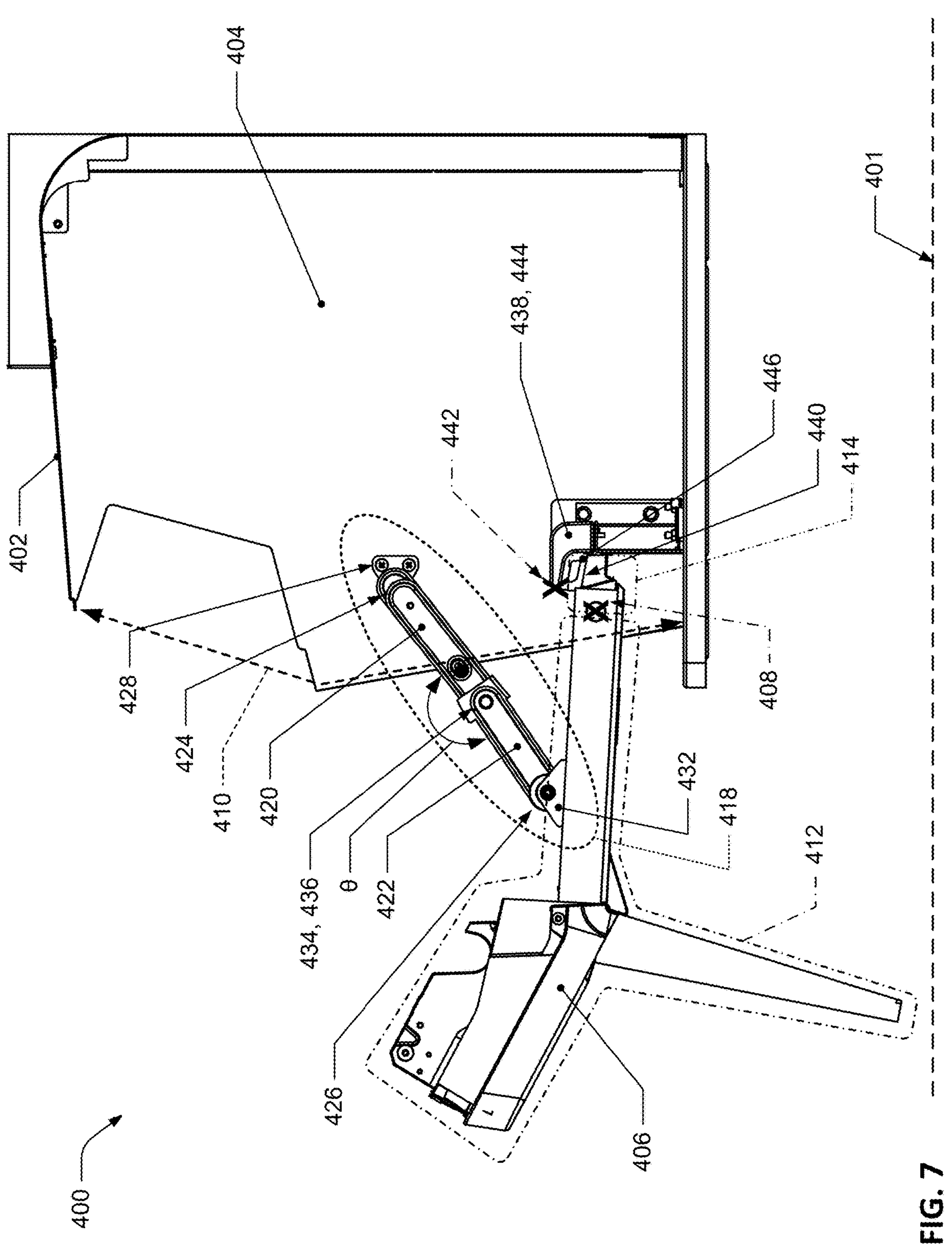
FIG. 7 depicts a side view of the electronic gaming machine of FIG. 5.

Additional or alternative features of the door stay and the door stopper will now be discussed. FIG. 7 depicts a side view of the electronic gaming machine of FIG. 5. The view here may be considered parallel to the hinge axis 408 which runs perpendicular to the page. The first portion 412, encircled by a dash-dot-dash shape, is outside and away from the opening 410 and the second portion 414, encompassed by a smaller dash-dot-dot rectangle, is inside the internal compartment 404. The floor 401 is also shown and when opening, the door 406 is configured to rotate about the hinge axis outwards and downwards towards the floor 401. During this opening rotation of the door 406, the door stay 418, the door stopper 438, or both are configured to stop or prevent further rotational movement of the door 406. For example, when the door reaches the first open position as illustrated here, the included angle θ of the door stay 418 reaches a maximum angle which, as mentioned above, in some embodiments is obtuse such as between about 174 degrees and 179 degrees, between about 175 degrees and 178 degrees, or between about 176 degrees and about 177 degrees, such as about 176.5 degrees, about 176.7 degrees, or about 176.9 degrees, while in other embodiments it may be greater than 180 degrees, such as 180.5 degrees, 181 degrees, or 182 degrees. It should also be noted that the obtuse angle may be close to 180 degrees, such as within 0.5 degrees, 0.1 degrees, or closer to 180 degrees. With the door stay at this maximum angle and configured to prevent further rotational movement of the door, the door is prevented from further rotation about the hinge axis 408.

Figure 8:
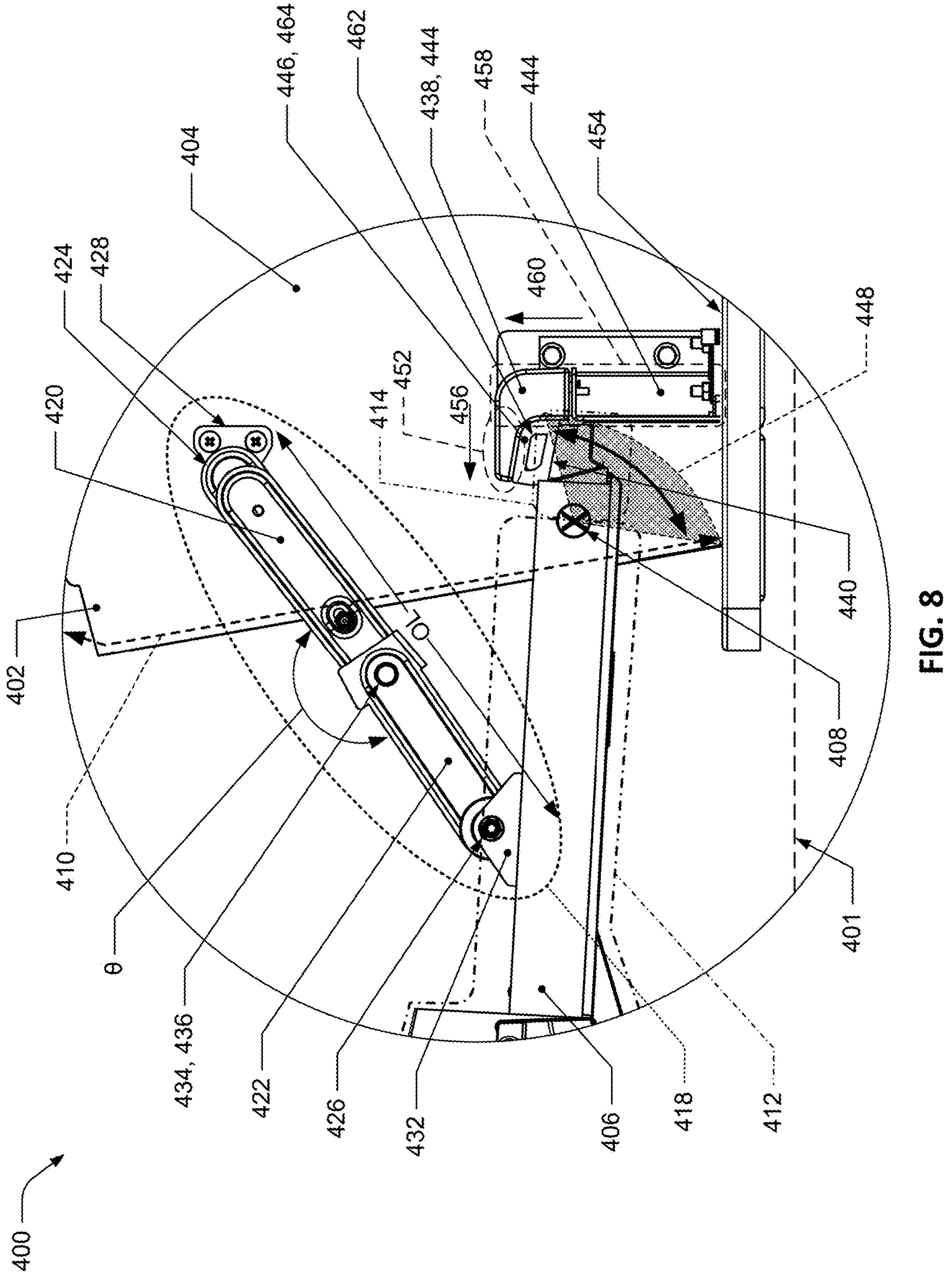
FIG. 8 depicts a magnified portion of FIG. 7, according to disclosed implementations.

Aspects of the door stopper 438 are also more clearly visible in FIG. 8 which depicts a magnified portion of FIG. 7, according to disclosed implementations. Here, a portion of the door stopper 438 is positioned within the rotational movement area or sector of the second portion 414 of the door 406. This rotational movement sector 448 is illustrated in FIG. 8 by a shaded pie-shape and heavy weight double sided arrow indicating the movement path of the second portion 414 of the door 406. When the door 406 rotates about the hinge axis 408 and reaches the first open position as depicted in FIGS. 7 and 8, the second portion 414 of the door 406 has contacted the door stopper 438 and the door stopper 438 at least in part prevents further rotational movement of the door 406. During the rotational movement of the door 406 about the hinge axis 408, the second portion 414 rotates or moves through the rotational movement sector 448. As part of stopping the movement of the second portion 414, the door stopper 438 is positioned within the rotational movement sector 448 of the door 406 such that the door 406 contacts the door stopper 438 during the door's movement.

The stationary support structure 444 is also more visible in FIG. 8. The stationary support structure 444 may have a horizontal portion 452 that may be considered to extend in a general horizontal direction towards the opening 410. In some implementations, the horizontal portion 452 may be perpendicular to the rotational axis 408 and in some instances, parallel to a bottom 454 of the cabinet 402. In some embodiments, the horizontal portion 452 may have a horizontal directional component 456 that is perpendicular to the rotational axis 408 and parallel to a bottom 454 of the cabinet 402. In some implementations, the stationary support structure 444 may also have a vertical portion 458 that is directly or indirectly connected to the bottom 454 of the cabinet 402. In some instances, the vertical portion 458 may be connected directly to the bottom 454 while in other instances, it may be indirectly connected to the bottom 454 by being directly connected to an intermediate structure. In other implementations, it may be connected to other portions of the cabinet 402, such as the walls of the cabinet. In some embodiments, the stationary support structure 444 may be connected to one or more walls of the cabinet 402 and the bottom 454. This vertical portion 458 may be perpendicular to the rotational axis 408 and in some instances, perpendicular to the bottom 454 of the cabinet 402. The vertical portion 458 may have a vertical directional component 460 that is perpendicular to the rotational axis 408 and perpendicular to the bottom 454 of the cabinet 402. This may account for portions of the stationary support structure 444 that may be at one or more angles with respect to the bottom 454 of the cabinet 402.

Figure 9:
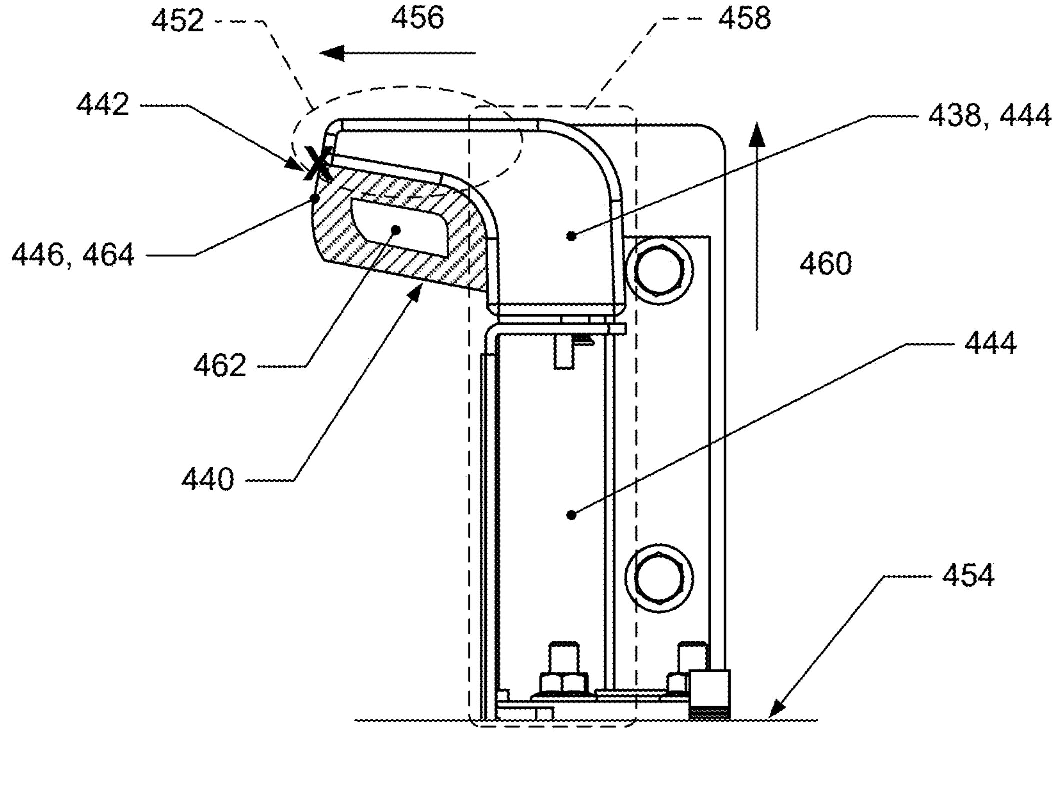
FIG. 9 depicts a side view of the stationary support structure and the compressible bumper of FIG. 8.

As provided above, the EGM 400 has a compressible bumper that is configured to be compressed between the door 406 and the stationary support structure 444 of the door stopper 438. FIG. 9 depicts a side view of the stationary support structure and the compressible bumper of FIG. 8. Here in FIG. 9 are various features of the stationary support structure 444 including the horizontal portion 452 and vertical portion 458, along with the compressible bumper 446. The contact surface 440 is a surface of the compressible bumper 446 in this example. The compressible bumper 446 may have a cross-sectional area with a hollow center to provide some compressibility and elastic deformability, which may provide shock and force absorption from the door's momentum into the door stopper 438. For example, as seen in FIG. 9, the compressible bumper 446 has a cross-sectional area, taken perpendicular to the axis 442, having a hollow center region 462. In some embodiments, the compressible bumper 446 may have a generally cylindrical shape, which may be tubular as well as partially cylindrical and partially rectangular. For instance, in FIG. 9, the compressible bumper 446 has a generally rectangular cross-sectional area with sidewalls 464 highlighted with cross-hatching and the hollow center region 462. In some implementations, like shown here in FIG. 8, the compressible bumper 446 may be connected to the stationary support structure 444. In some other embodiments, the compressible bumper 446 may be connected to the second portion 414 of the door 406.

As provided above, in the first open position, the included angle θ between the two links 420 and 422 of the door stay 418 is a first obtuse angle and the second portion 414 of the door 406 is in contact with the door stopper 438. In some embodiments, while in the first open position, the compressible bumper 446 is at least partially compressed between the stationary support structure 444 and the second portion 414 of the door 406. This partial compression may be due to the weight of the door 406, the operation of the door stay 418, or both. During opening of the door 406 and before compressing the compressible bumper 446, the door 406 makes initial contact with the contact surface 440 of the door stopper and this may be considered a second open position.

Figure 10:
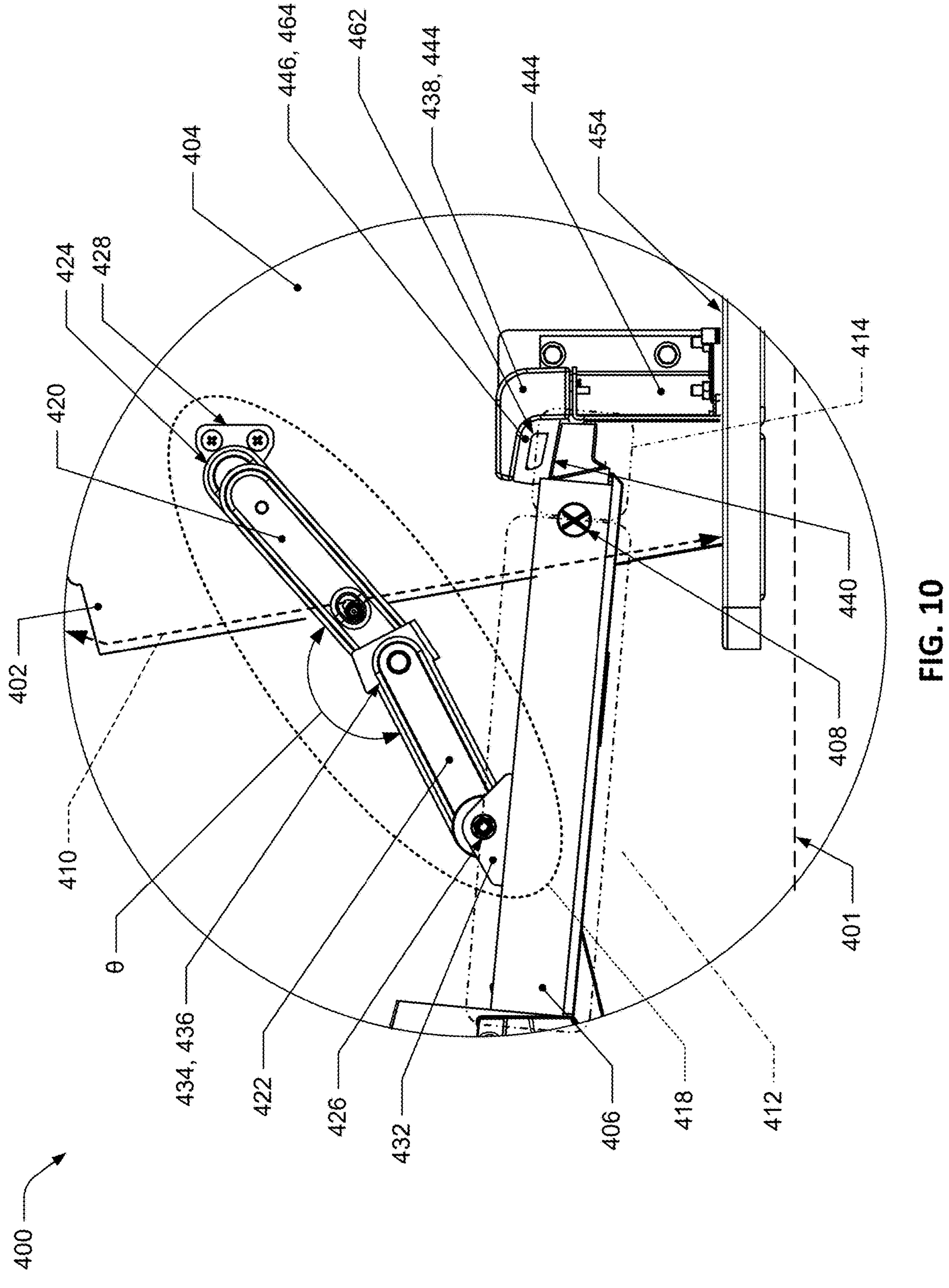
FIG. 10 depicts the magnified side view of FIG. 8 with the door and door stay in a second open position.

FIG. 10 depicts the magnified side view of FIG. 8 with the door and door stay in a second open position. As can be seen here, the included angle θ between the two links 420 and 422 of the door stay 418 is a second obtuse angle less than the first obtuse angle. This second obtuse angle may range between about 120 degrees and 160 degrees, between about 135 degrees and 155 degrees, between about 140 degrees and 150 degrees, or between about 142 degrees and 148 degrees. In this second open position, the second portion 414 of the door 406 is in contact with the contact surface 440 and the compressible bumper 446 is not compressed. In some instances, the compressible bumper 446 may be compressed in the second open position, but compressed less than in the first open position.

Figure 11:
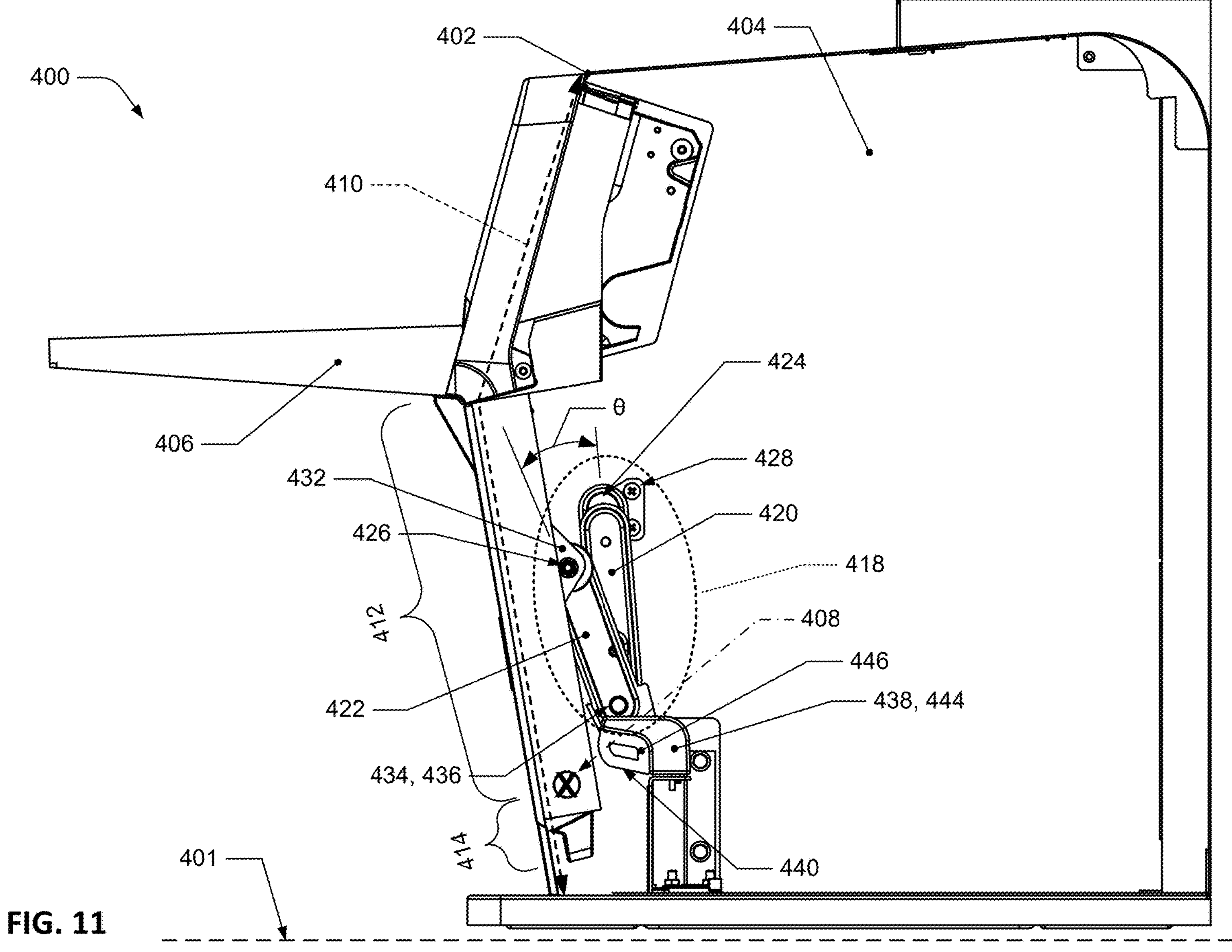
FIG. 11 depicts the side view of FIG. 7 with the door and door stay in a closed position.

When the door 406 is in the closed position, the included angle θ between the two links 420 and 422 of the door stay 418 is acute and the second portion 414 of the door 406 is not in contact with the door stopper 438. FIG. 11 depicts the side view of FIG. 7 with the door and door stay in a closed position. As can be seen here, the included angle θ between the two links 420 and 422 of the door stay 418 is an acute angle. This acute angle may range between 20 degrees and 50 degrees, for instance. In this closed position, the first portion 412 covers the opening 410 and the second portion 414 of the door 406 is not in contact with the contact surface 440 and the compressible bumper 446.

In some embodiments, the EGM 400 may have one or more pistons or shock absorbers that spans between the door 406 and cabinet 402. The one or more pistons may be configured to absorb or dampen some of the weight and rotational movement of the door during opening. In some implementations, the one or more pistons may be configured to exert compressive forces to pull the door closer to the cabinet and thereby assist with closing the door. For example, referring to FIG. 6, a piston 470 is shown and it includes a first end 472 rotatably connected to the cabinet 402 and a second end 474 rotatably connected to the door 406. The piston 470 may be configured to provide dampening or shock absorption when the door is opening, and the piston length is increasing, to absorb some of the rotational motion during opening from the closed position to the first and second open positions. Some such pistons, or shock absorbers, may be mono tube or twin tube configurations, and may be digressive or linear. In some embodiments, the piston 470 may be configured to provide a compressive force when the door is closing, and the piston length is decreasing, to assist with pulling the door closer to the cabinet. In some embodiments, only one such piston is included while in other two or more are provided. The EGM 400 may have a first piston configured to absorb forces during opening and a second piston configured to exert compressive forces to shorten the length during closing.

Figures 12, 13:
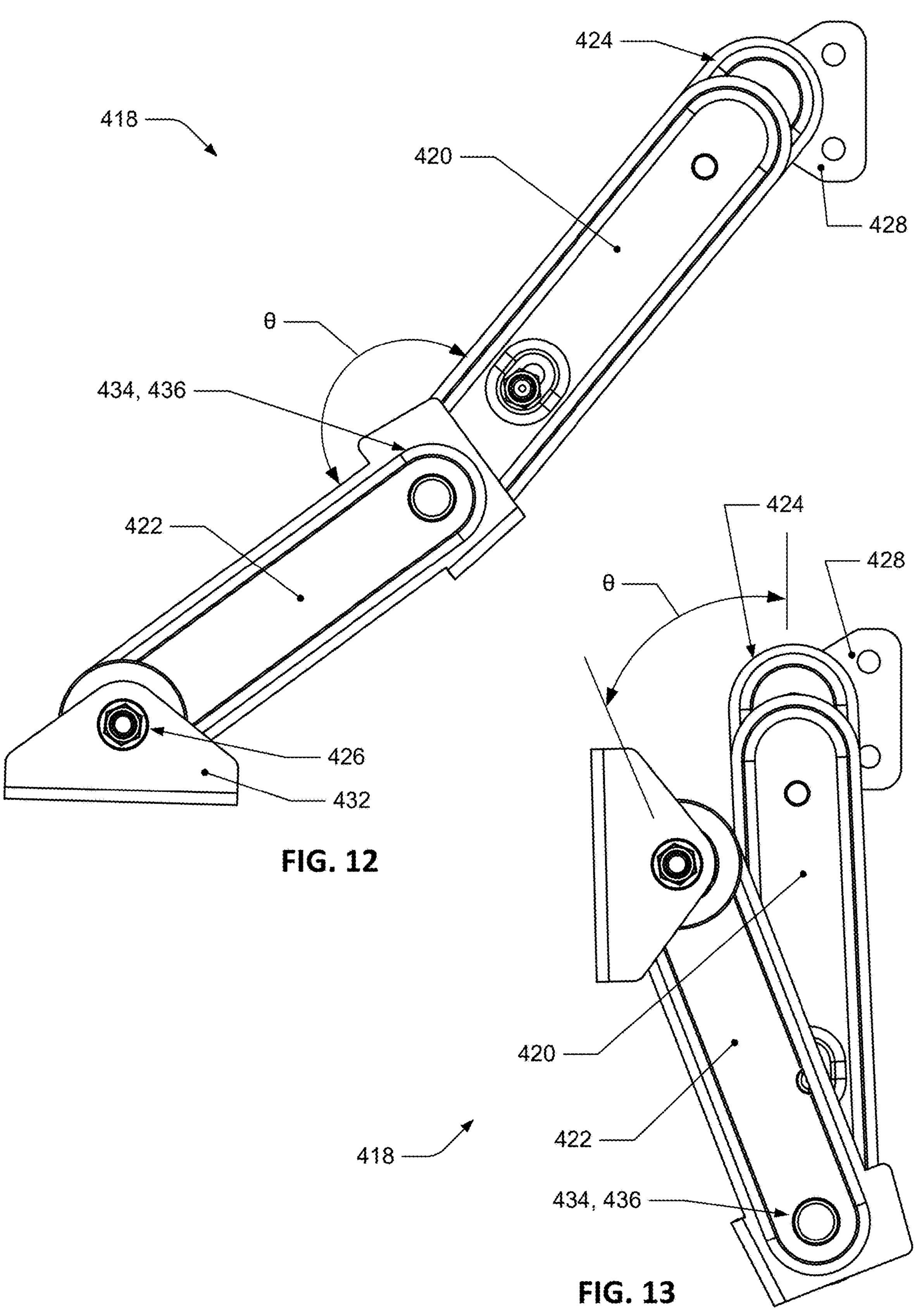
FIG. 12 depicts a side view of door stay according to various embodiments.
FIG. 13 depicts the side view of the door stay of FIG. 12 in a second configuration.

Additional or alternative features of the door stay will now be discussed. FIG. 12 depicts a side view of door stay according to various embodiments. This may be considered a door stay assembly and may be the same door stay 418 as provided herein above. The door stay 418 of FIG. 12 has the first link 420 and second link 422 that are rotatably connected to each other. The first link 420 has the first end 424 and the second end 434, and the second link has the first end 426 and the second end 436 rotatably connected to the second end 434 of the first link 420. The first link 420 and the second link 422 define an included angle θ that in the depicted example, is obtuse. As provided above, the door stay 1218 is configured to be moved between different positions during movement of the door such that the included angle θ between the first and second links 420 and 422 is one or more obtuse angles, and one or more acute angles. FIG. 13 depicts the side view of the door stay of FIG.

12 in a second configuration and here, the included angle θ between the first and second links 420 and 422 is acute.

Figure 14:
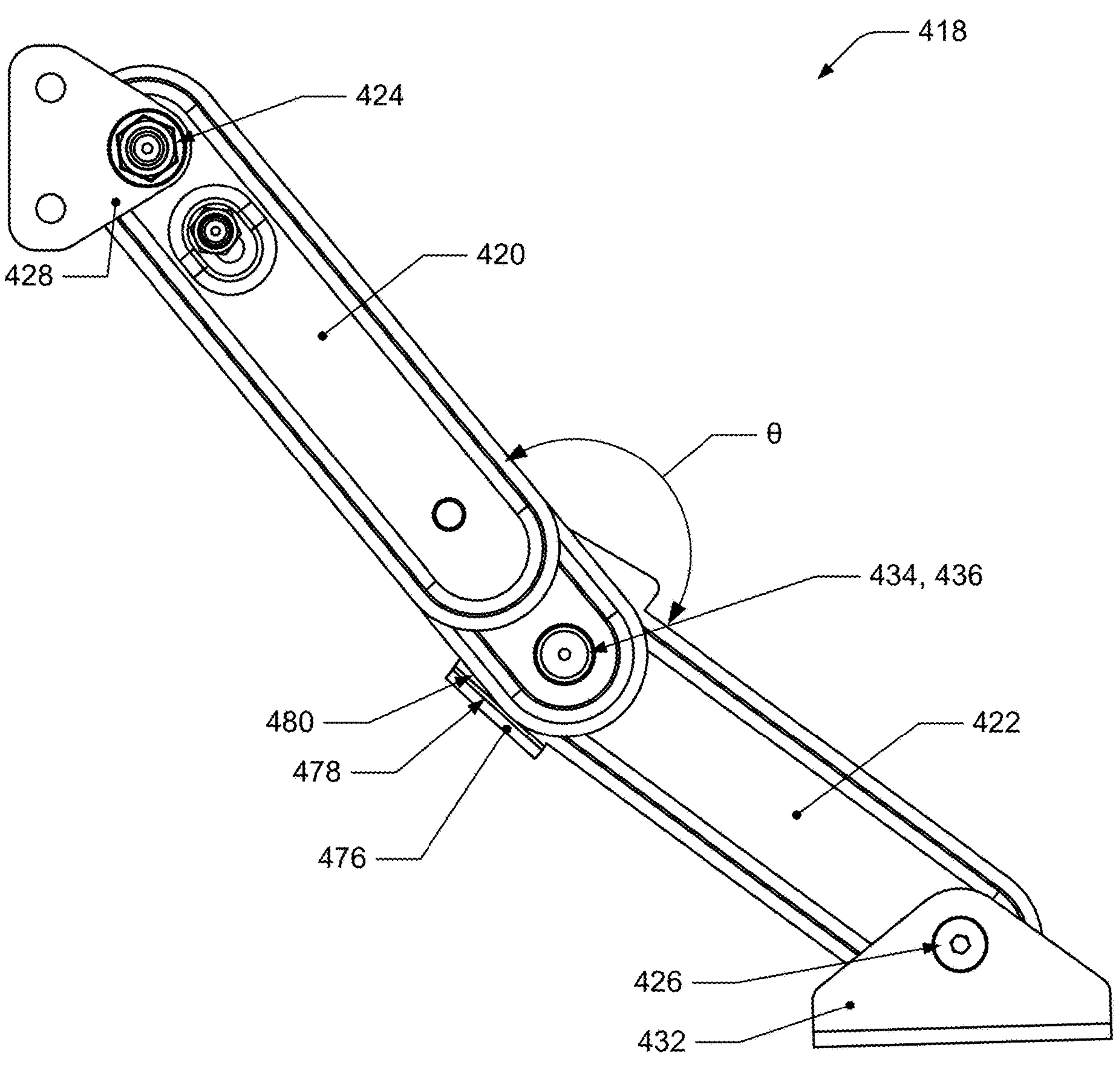
FIG. 14 depicts the opposite side angle of the door stay of FIG. 12.

In some implementations, the door stay 418 is configured to provide a hard stop for the door. In some instances, the hard stop is provided by the rotatability of the links along with the connection points of the hard stay to the door and to the cabinet. When at the first open position described above, such as in FIGS. 6 and 7, the door stay 418 stops the door and prevents the door from rotating further, in conjunction with the door stopper provided above. In some implementations, the door stay may have configurations that prevent its links from rotating past undesirable angles, such as a physical blocker. FIG. 14 depicts the opposite side angle of the door stay of FIG. 12. The second link 422 here has a rotation blocker 476 with a blocking surface 478 that is configured to contact the first link 420, such as a side 480, of the first link 420 at a particular angle of rotation, such as when the included angle θ is about 176 degrees, about, 177 degrees, 179 degrees, about 180 degrees, or about 181 degrees, for example. In FIG. 14, the rotation blocker 476 is not yet in contact with the side 480 of the first link 420. When the blocking surface 478 is in contact with the first link 420, the first and second link 420 and 422 cannot be rotated farther with respect to each other such that the included angle θ cannot be made bigger. Similar to provided above, the rotation blocker 476 is placed within a rotational movement arc of the first link 420 with respect to the second link 422. When the first link 420 rotates with respect to the second link 422 at the second ends 434 and 436, the first link is caused to stop by the rotation blocker 476 at a particular location within its rotational movement arc.

Figure 15:
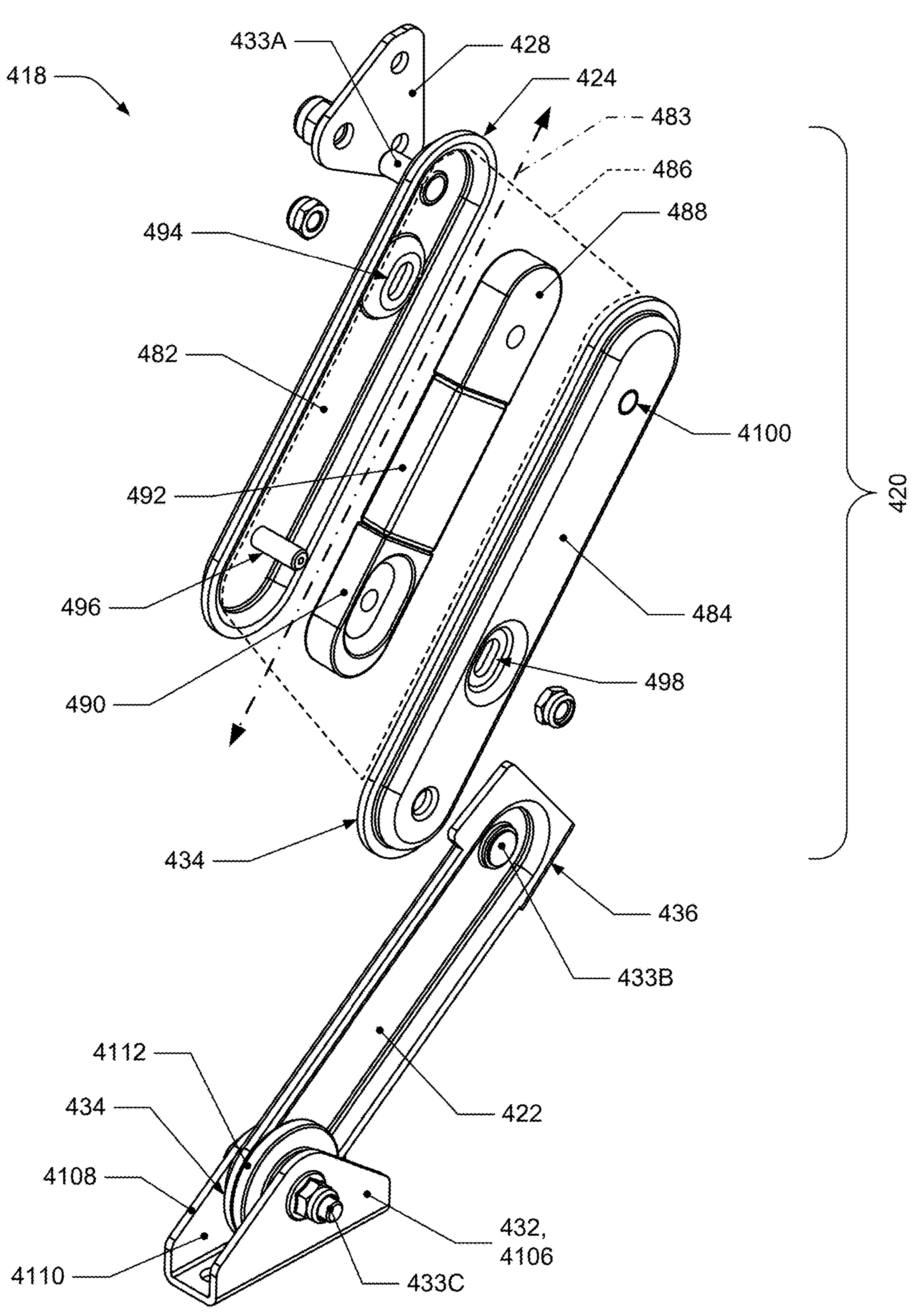
FIG. 15 depicts an off-angle partially exploded view of the door stay of FIG. 12.

In some implementations, one of the links of the door stay may have internal force dampening features positioned within two portions of the link that are configured to move relative to each other. FIG. 15 depicts an off-angle partially exploded view of the door stay of FIG. 12. Here, the first link 420 is partially exploded with respect to the first bracket 428 and the second link 422, and with respect to its components. The first link 420 extends along an axis 483 and has a first link portion 482 and a second link portion 484 that overlap with each other, are slidably connected to each other, and that partially define an internal chamber 486 in-between the two link portions. The first link portion 482 has the first end 424 of the first link 420. In some implementations, like in FIG. 15, the first end 424 is rotatably connected to the first bracket 428 via a pin 433A that may, in some instances, extend through a hole in the first bracket 428 and a hole in the first link portion 482. In some embodiments, the pin 433A may be a separate part, a part of the first link portion 482, or a part of the first bracket 428. The second link portion 484 has the second end 434 of the first link 420 and in the depicted implementation, is rotatably connected to the second link 422 via another pin 433B.

The first link 420 also has a first block 488, a second block 490, and a compressible member 492 positioned in the internal chamber 486. The compressible member 492 is interposed between the first block 488 and the second block 490 along the axis 483. The first link portion 482 has a first groove 494 on one end and a first pin 496 on the opposite end. The first pin 496 is configured to remain stationary with respect to the first link portion 482. The second link portion 484 has a second groove 498 on one end and a second pin 4100 on the other end. The second pin 4100 is configured to remain stationary with respect to the second link portion 484. The first pin 496 of the first link portion 482 is adjacent to the second block 490 and the second groove 498 of the second link portion 484, and extends through the second block 490 and the second groove 498. The second block 490 is thereby configured to remain stationary relative to first link portion 482. The first pin 496 is also configured to move or slide within the second groove 498 and with respect to the second link portion 484. The connection of the second block 490 to the first pin 496 and its fixed position with respect to the first link portion 482 also provides for the second block 490 to move with the first pin 496 with respect to the second link portion 484.

Similarly, the second pin 4100 of the second link portion 484 is adjacent to the first block 488 and the first groove 494, and extends through the first block 488 and the first groove 494. The first block 488 is thereby configured to remain stationary relative to second link portion 484. The second pin 4100 is also configured to move or slide within the first groove 494 and with respect to the first link portion 482. The connection of the first block 488 to the second pin 4100 and its fixed position with respect to the second link portion 484 also provides for the first block 488 to move with the second pin 4100 with respect to the first link portion 482. These configurations provide for the first link portion 482, the first pin 496, and the second block 490 to move together along the axis 483 in a first direction, and provide for the second link portion 484, the second pin 4100, and the first block 488 to move together along the axis 483 in a second direction opposite the first direction. These configurations of the first link 420 thereby provide for the first and second link portions 482 and 484, and the first and second blocks 488 and 490, to be slidably movable with respect to each other along the axis 483.

In some embodiments, the door stay has a connecter bracket for connecting to the door and configured to provide a reinforced and durable connection. The second bracket 432, more clearly visible in FIG. 15, may be considered a connecting bracket that has a first flange 4106, a second flange 4108 opposite and offset from the first flange 4106, and a cavity 4110 at least partially defined between and by the first and second flanges 4106 and 4018. The first end 426 of the second link 422 is positioned within the cavity 4110 and rotatably connected to the first and second flanges 4106 and 4108. A spacer wheel 4112 may also be positioned in between the first and second flanges 4106 and 4108 to provide spacing and support for the first end 426. The rotatable connection in this example is a pin 433C extending through the first and second flanges 4106 and 4108, and the first end 426. This second bracket 432 is configured to provide a strong and reinforced rotatable connection between the door stay and the door during opening.

Figures 16A, 16B:
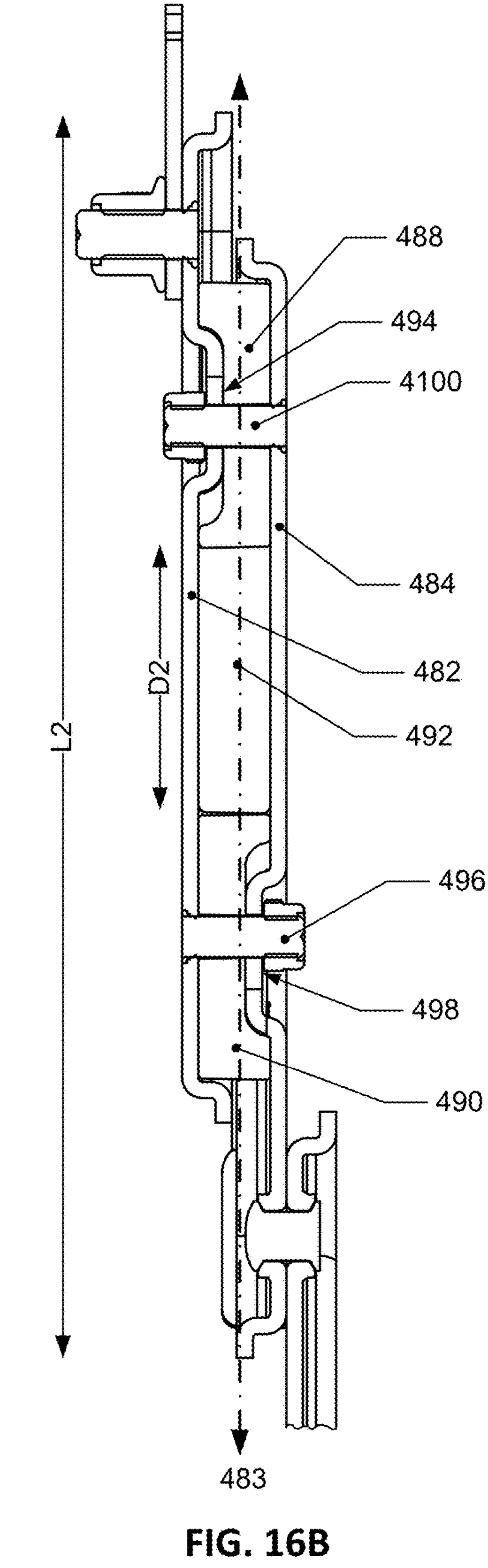
FIGS. 16A and 16B depict magnified cross-sectional plan views of a portion of the door stay of FIG. 15.

With the movability of two link portions of the first link 420, the first link 420 is configured to have a first length and a second length along the axis, with the second length longer than the first length. As the first and second link portions move in opposite directions along the axis 483 and with respect to each other, the first and second blocks 488 and 490 move closer to each other and are caused to compress the compressible member 492. This movement by the first link is thereby configured to provide shock and force absorption as the door opens and exerts an extension force on the door stay 418. FIGS. 16A and 16B depict magnified cross-sectional plan views of a portion of the door stay of FIG. 15. In these Figures, the view is perpendicular to the axis 483. As can be seen, the internal chamber 486 (labeled only in FIG. 16A for clarity) is formed by the first link portion 482 and the second link portion 484 with the first block 488, the second block 490, and the compressible member 492 positioned therein along the axis 483. In FIG. 16A, the first link 420 has a first length L1 along the axis 483 and the first block 488 is offset from the second block 490 along the axis 483 by a first distance D1.

As a force is exerted on the first length along axis 483, such as an extension force during opening of the door, the first and second link portions 482 and 484 are caused to move relative to each other in opposite directions along the axis 483. For example, when force F is exerted by the door along the axis 483 to pull the second end 434 of the first link 420 away from the first end 424, the second link portion 484 is caused to move in the same direction 4102 as the force F, and in the opposite direction relative to the first link portion 482. This force F may be considered an axial force. In some implementations, the relative motion between the first and second link portion 482 and 484 may be considered as the second link portion 484 moving in the first direction 4102 relative to the first link portion 482, and/or the first link portion 482 moving in the second direction 4104, which is opposite the first direction 4102, relative to the second link portion 484.

As the first and second link portion 482 and 484 move in opposite directions relative to each other, the second pin 4100, the first block 488, and the second link portion 484 move in the first direction 4102 relative to the first link portion 482, first pin 496, and second block 490. This movement causes the second pin 4100 to slide within the first groove 494 of the first link portion 482. Further, the first pin 496, the second block 490, and the first link portion 482 are concurrently caused to move in the second direction 4104, relative to the second link portion 484. This movement causes the first pin 496 to move within the second groove 498 of the second link portion 484. As illustrated, the first link portion 482 and second link portion 484 are slidably connected to each other. This relative movement also causes the length of the first link 420 to increase to a second length L2 larger than the first length L1. Additionally, this movement causes the first block 488 and second block 490 to move closer to each other such that they are offset from each other by a second distance D2 less than the first distance D1. The difference between D1 and D2 may be the distance that each block can travel within the internal chamber 486 and that each pin can travel within each respective groove. In some implementations, this distance may be less than or equal to about 20 mm, about 10 mm, about 8 mm, about 6 mm, about 4 mm, about 2 mm, or about 1 mm. This movement of the blocks 488 and 490 and reduced offset distance D2 compresses the compressible member 492 thereby providing a shock absorption caused by the force F on the door stay 418. This force F may be caused by the opening of the door described herein. As illustrated, the compressible member 492 is compressed more while the first link 420 is at the second length L2 than at the first length L1.

As illustrated herein, some implementations of the door stay have the first link with its movable link portions rotatably connected to the cabinet while the second link without movable link portions is connected to the door. In other implementations, the door stay may be reversed such that the first link and its movable link portions (e.g., 482 and 484) are connected to the door while the second link is connected to the cabinet.

Since the first link is configured to have a first length L1 and second length L2, the door stay 418 is also configured to have an first overall length and second overall length longer than the first overall length. For example, when the first link has the first length, the door stay has a first overall length and when the first link has the second length, the door stay has a second overall length greater than the first overall length. Referring back to the open and closed positions above, when the door is in the closed position of FIGS. 4B and 11, for instance, the first link 420 has the first length L1. Further, as the door opens, the first link 420 remains as the first length until the force exerted by door on the door stay overcomes the compressive force of the compressible member and causes relative motion between the first and second link portions 482 and 484 in opposite directions, described above. This force by the door causes the first link to get larger and thereby causes the first overall length of the door stay to get larger. The overall length OL of the door stay 418 is shown in FIG. 8. In this Figure, the overall length OL may be the second, larger one length given the forces exerted on the door stay 418.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items.

The term "between," as used herein and when used with a range of values, is to be understood, unless otherwise indicated, as being inclusive of the start and end values of that range. For example, between 1 and 5 is to be understood to be inclusive of the numbers 1, 2, 3, 4, and 5, not just the numbers 2, 3, and 4.

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood. It is also to be understood that use of the ordinal indicator "first" herein, e.g., "a first item," should not be read as suggesting, implicitly or inherently, that there is necessarily a "second" instance, e.g., "a second item."

While the disclosure has been described with respect to the figures, it will be appreciated that many modifications and changes may be made by those skilled in the art without departing from the spirit of the disclosure. Any variation and derivation from the above description and figures are included in the scope of the present disclosure as defined by the claims.

What is claimed is:

1. An electronic gaming machine, comprising:

a cabinet having a height and a width and defining an internal compartment and an opening that provides access to the internal compartment;

a door rotatably connected to the cabinet, configured to rotate about a hinge axis parallel to the width of the cabinet between a closed position and a first open position, and having a first portion on a first side of the hinge axis and a second portion, smaller than the first portion, on a second side of the hinge axis;

a door stay having a first link with a first end and a second end, and a second link with a first end and a second end; and a door stopper connected to the cabinet, positioned in the internal compartment and adjacent to the hinge axis, and having a contact surface extending along an axis parallel to the hinge axis, wherein:

the first end of the first link is rotatably connected to the cabinet, the first end of the second link is rotatably connected to the first portion of the door, the second end of the first link and the second end of the second link are rotatably connected to each other, in the closed position, the door covers the opening and an included angle defined by the first link and the second link is acute, and in the first open position:

the first portion of the door is outside the internal compartment and away from the opening, the second portion of the door is inside the internal compartment and in contact with the contact surface of the door stopper, and the included angle defined by the first link and the second link is a first obtuse angle.

2. The electronic gaming machine of claim 1, wherein:

the door stopper further has a stationary support structure and a compressible bumper having the contact surface, and in the first open position the compressive bumper is compressed between the second portion of the door and the stationary support structure.

3. The electronic gaming machine of claim 2, wherein:

the door is further configured to rotate between the closed position, the first open position, and a second open position, and in the second open position:

the included angle defined by the first link and the second link is a second obtuse angle less than the first obtuse angle, the second portion of the door is in contact with the contact surface of the compressive bumper, and the compressive bumper is compressed less than in the first open position.

4. The electronic gaming machine of claim 2, wherein the stationary support structure:

is connected to a bottom of the cabinet, has a horizontal portion extending towards the opening, and in the first open position the compressive bumper is compressed between the second portion of the door and the horizontal portion of the stationary support structure.

5. The electronic gaming machine of claim 2, wherein the compressive bumper has a cross-sectional area having a hollow center region.

6. The electronic gaming machine of claim 1, wherein:

the door stopper further has a stationary support structure having the contact surface, the door has a compressive bumper, and in the first open position the compressive bumper is compressed between the second portion of the door and the stationary support structure.

7. The electronic gaming machine of claim 1, wherein the door stay:

is further configured to have a first overall length and a second overall length longer than the first overall length, and further has an internal compressive member configured to be compressed while the door stay is at the second overall length more than while the door stay is at the first overall length.

8. The electronic gaming machine of claim 7, wherein:

the first link or the second link has an internal chamber that contains a first block, a second block, and the internal compressive member between the first block and the second block, and the internal chamber is defined by a first link portion of the respective link and a second link portion of the respective link that overlaps with and is slidably connected to the first portion.

9. The electronic gaming machine of claim 7, wherein in the first open position, the door stay is at the second overall length.

10. The electronic gaming machine of claim 1, wherein the door stay further has a hard stop configured to prevent the included angle defined by the first link and the second link from extending more than 185 degrees.

11. The electronic gaming machine of claim 1, wherein:

the second portion of the door has a first width in a direction parallel to the hinge axis, and the contact surface has a second width in the direction parallel to the hinge axis that is at least 50% of the first width.

12. The electronic gaming machine of claim 1, further comprising a first piston connected to the first portion and to the cabinet and configured to absorb extension forces.

13. The electronic gaming machine of claim 1, further comprising a second piston connected to the first portion and to the cabinet and configured to exert a compressive force to shorten the second piston.

14. The electronic gaming machine of claim 1, wherein no other door stay is connected to the door.

15. A door stay assembly, comprising:

a first link extending along an axis and having:

a first end and a second end, a first link portion having the first end, a second link portion having the second end, and overlapping with and slidably connected along the axis to the first link portion, an internal chamber at least partially defined by the first link portion and the second link portion, and a first block, a second block, and a compressible member positioned in the internal chamber; and a second link having a first end and a second end, wherein:

the second end of the first link is rotatably connected to the second end of the second link, the compressible member is in between the first block and the second block, the first link is configured to have a first length and a second length longer than the first length, at the first length, the first block is offset from the second block by a first distance along the axis, and at the second length:

the first block is offset from the second block by a second distance along the axis smaller than the first distance, and the compressible member is compressed by the first block and the second block.

16. The door stay assembly of claim 15, wherein:

the first block remains stationary relative to the second link portion, and the second block remains stationary relative to the first link portion.

17. The door stay assembly of claim 15, wherein:

the first link portion has a first groove, the second link portion has a second groove, and the first link further has:

a first pin that extends through the first groove, the first block, and the second link portion, and that is configured to move within the first groove and to remain stationary relative to the second link portion, and a second pin that extends through the second groove, the second block, and the first link portion, and that is configured to move within the second groove and to remain stationary relative to the first link portion.

18. The door stay assembly of claim 15, wherein at the first length, the compressible member is not compressed by the first block and the second block.

19. The door stay assembly of claim 15, further comprising a connecting bracket having:

a first flange, a second flange opposite the first flange, and a cavity at least partially defined by the first flange and the second flange, wherein the first end of the second link is positioned within the cavity and rotatably connected to the first flange and the second flange.

20. An electronic gaming machine, comprising:

a cabinet defining an internal compartment and an opening that provides access to the internal compartment;

a door rotatably connected to the cabinet and configured to rotate between a closed position and an open position; and a door stay assembly having:

a first link extending along an axis and having:

a first end and a second end, a first link portion having the first end, a second link portion having the second end, and overlapping with and slidably connected along the axis to the first link portion, an internal chamber at least partially defined by the first link portion and the second link portion, and a first block, a second block, and a compressible member positioned in the internal chamber; and a second link having a first end and a second end, wherein:

the second end of the first link is rotatably connected to the second end of the second link, the first end of the second link is rotatably connected to the door, the first end of the first link is rotatably connected to the cabinet, the compressible member is in between the first block and the second block, the first link is configured to have a first length and a second length longer than the first length, at the first length, the first block is offset from the second block by a first distance along the axis, at the second length the first block is offset from the second block by a second distance along the axis smaller than the first distance, and the compressible member is compressed by the first block and the second block, in the closed position, the first link has the first length, and in the open position, the first link has the second length.

* * * * *